(12) United States Patent
He et al.

(10) Patent No.: US 11,263,422 B2
(45) Date of Patent: Mar. 1, 2022

(54) ULTRASOUND FINGERPRINT SENSING AND SENSOR FABRICATION

(71) Applicant: Shenzhen Goodix Technology Co., Ltd., Shenzhen (CN)

(72) Inventors: Yi He, San Diego, CA (US); Bo Pi, San Diego, CA (US)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 698 days.

(21) Appl. No.: 15/968,420

(22) Filed: May 1, 2018

(65) Prior Publication Data

US 2018/0314871 A1 Nov. 1, 2018

Related U.S. Application Data

(60) Provisional application No. 62/492,875, filed on May 1, 2017.

(51) Int. Cl.
*G06K 9/00* (2006.01)
*G01S 15/89* (2006.01)
(Continued)

(52) U.S. Cl.
CPC .......... *G06K 9/0002* (2013.01); *B06B 1/0207* (2013.01); *B06B 1/0607* (2013.01);
(Continued)

(58) Field of Classification Search
CPC ........ G06K 9/00; G06K 9/001; G06K 9/0002; G01S 15/8925; G01S 7/52079;
(Continued)

(56) References Cited

U.S. PATENT DOCUMENTS

| 4,747,192 A | 5/1988 | Rokurota |
| 6,720,712 B2 * | 4/2004 | Scott .................... G06K 9/0002 310/316.01 |

(Continued)

FOREIGN PATENT DOCUMENTS

| CN | 104680126 A | 6/2015 |
| CN | 106295625 A | 1/2017 |

(Continued)

OTHER PUBLICATIONS

International Search Report from PCT/CN2018/082324 dated Jun. 27, 2018 (4 pages).

(Continued)

*Primary Examiner* — Isam A Alsomiri
*Assistant Examiner* — Amie M Ndure
(74) *Attorney, Agent, or Firm* — Perkins Coie LLP

(57) ABSTRACT

Disclosed are systems, devices and methods for providing fingerprint sensors based on ultrasound imaging techniques in electronic devices and fabrication techniques for producing ultrasound-based fingerprint sensors. In some aspects, an ultrasound fingerprint sensor device includes an intermediate layer coupled to a base chip including an integrated circuit having conducive contacts at a surface of the base chip, the intermediate layer including an insulation layer formed on the base chip and a corresponding array of channeling electrode structures coupled to the conductive contacts and passing through the insulation layer, in which the channeling electrodes terminate at or above a top surface of the insulation layer to provide bottom electrodes; a plurality of ultrasonic transducer elements including an acoustic transducer material coupled to the bottom electrodes; and a plurality of top electrodes positioned on the ultrasonic transducer elements.

30 Claims, 14 Drawing Sheets

(51) Int. Cl.
| | |
|---|---|
| *G01S 7/52* | (2006.01) |
| *B06B 1/06* | (2006.01) |
| *H01L 41/113* | (2006.01) |
| *H01L 41/332* | (2013.01) |
| *H01L 41/338* | (2013.01) |
| *B06B 1/02* | (2006.01) |
| *H01L 41/312* | (2013.01) |
| *H01L 41/18* | (2006.01) |

(52) U.S. Cl.
CPC ........ *B06B 1/0622* (2013.01); *G01S 7/52079* (2013.01); *G01S 15/8918* (2013.01); *G01S 15/8925* (2013.01); *G06K 9/001* (2013.01); *H01L 41/1132* (2013.01); *H01L 41/312* (2013.01); *H01L 41/332* (2013.01); *H01L 41/338* (2013.01); *B06B 2201/70* (2013.01); *H01L 41/18* (2013.01)

(58) Field of Classification Search
CPC ........ G01S 15/89; G01S 7/52; G01S 15/8918; H01L 41/332; H01L 41/338; H01L 41/312; H01L 41/18; H01L 41/113; H01L 41/1132; B06B 2201/70; B06B 1/02; B06B 1/06; B06B 1/0207; B06B 1/0622; B06B 1/0607
See application file for complete search history.

(56) References Cited

U.S. PATENT DOCUMENTS

| | | | | |
|---|---|---|---|---|
| 6,812,621 | B2* | 11/2004 | Scott | G06K 9/0002 310/328 |
| 7,104,134 | B2* | 9/2006 | Amano | G01L 1/16 73/702 |
| 7,514,842 | B2* | 4/2009 | Scott | G06K 9/0002 310/316.01 |
| 7,751,595 | B2 | 7/2010 | Russo | |
| 8,601,876 | B2 | 12/2013 | Schneider et al. | |
| 9,607,203 | B1 | 3/2017 | Yazdandoost et al. | |
| 9,613,246 | B1 | 4/2017 | Gozzini et al. | |
| 2010/0239133 | A1* | 9/2010 | Schmitt | B06B 1/0629 382/124 |
| 2013/0257224 | A1 | 10/2013 | Wodnicki | |
| 2015/0357375 | A1 | 12/2015 | Tsai et al. | |
| 2016/0148032 | A1 | 5/2016 | Wang | |
| 2016/0224816 | A1 | 8/2016 | Smith et al. | |
| 2017/0059699 | A1* | 3/2017 | Mathe | A61B 5/117 |
| 2017/0110504 | A1* | 4/2017 | Panchawagh | B06B 1/0207 |
| 2018/0068154 | A1* | 3/2018 | Sun | H01L 41/29 |

FOREIGN PATENT DOCUMENTS

| | | |
|---|---|---|
| CN | 106326877 A | 1/2017 |
| CN | 106328609 A | 1/2017 |
| CN | 106412780 A | 2/2017 |

OTHER PUBLICATIONS

European Search Report from EP18794708.0 dated May 6, 2019.
European Supplementary Search Report from EP18794708.0 dated Aug. 9, 2019.
Office Action dated Jul. 15, 2020 for Chinese Patent Application No. 201880001994.5 (17 pages).
Communication pursuant to Article 94(3) EPC dated Jul. 20, 2020 for European Patent Application No. 18794708.0 (9 pages).

* cited by examiner

Legend of Example Features
311e- Ultrasonic transducer element
313e- Top electrodes
317- Ultrasonic wave driver circuit
321- Ultrasonic receiver circuit
319- Connect wires
323- Connect wires

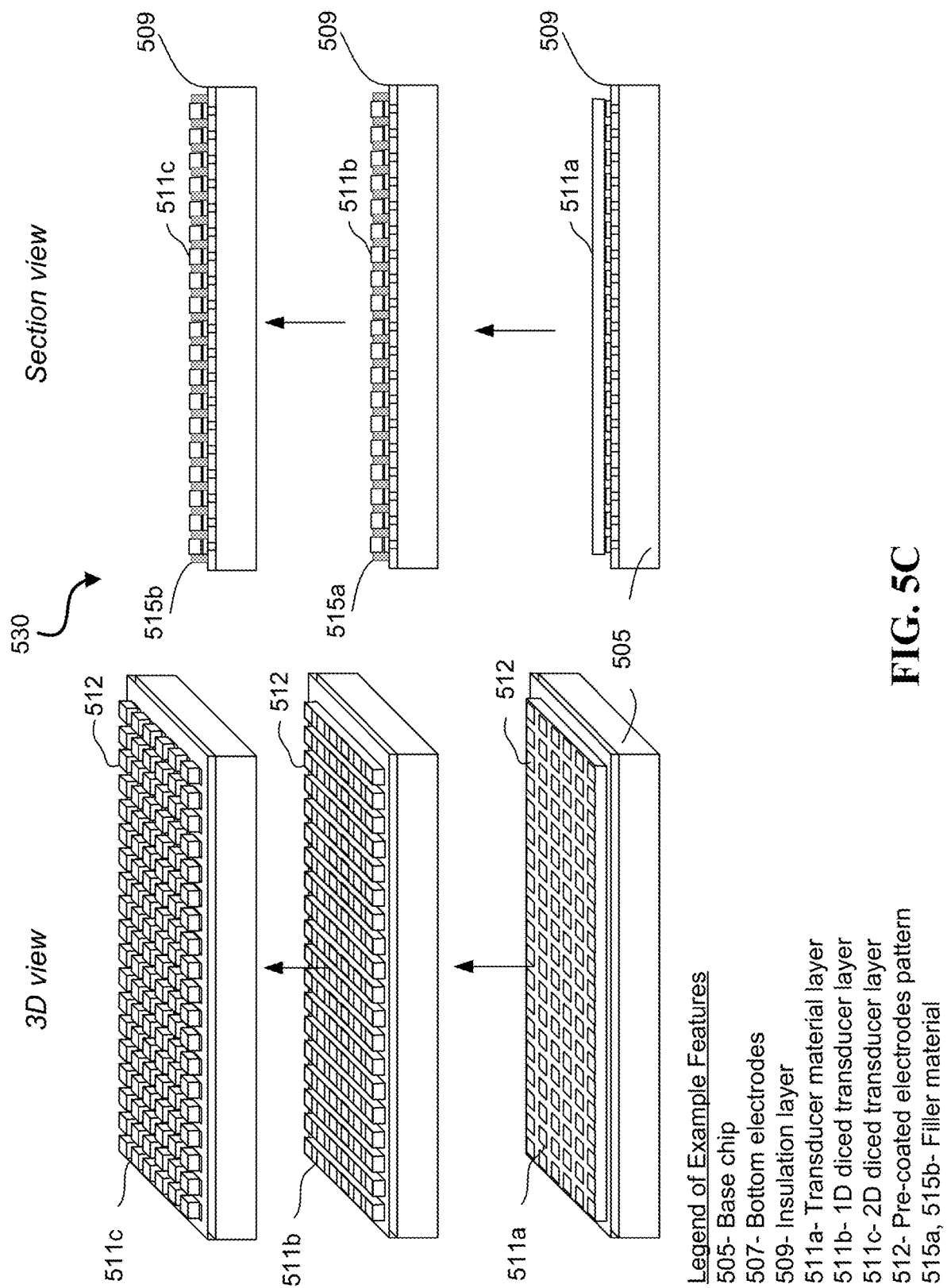

Legend of Example Features
731 - Acoustic receiver assembly
733 - Acoustic transmitter assembly

Legend of Example Features
305 - Base chip with integrated circuit
307 - Bottom electrode
309 - Insulation layer
711c - Ultrasonic transducer element
315 - Filling material Legend of Example Features
305 - Base chip with integrated circuit
307 - Bottom electrode
309 - Insulation layer
711b - Ultrasonic transducer Bars
315 - Filling material Legend of Example Features
841 - Electrodes for Ultrasonic transducer elements
842 - Connections to Driver & Receiver circuits
843 - Switch elements to select ultrasonic transducer elements to driver&receiver circuits
844 - Connections to control the switch elements
851 - Driver and Receiver circuits
852 - Switch control circuits

ULTRASOUND FINGERPRINT SENSING AND SENSOR FABRICATION

CROSS-REFERENCE TO RELATED APPLICATIONS

This patent document claims the benefits and priority of U.S. Provisional Patent Application No. 62/492,875, filed on May 1, 2017. The entire content of the aforementioned patent application is incorporated by reference as part of the disclosure of this patent document.

TECHNICAL FIELD

This patent document relates to sensing of fingerprints and performing one or more sensing operations of other parameter measurements of in electronic devices or systems, including portable devices such as a mobile device or a wearable device and larger systems.

BACKGROUND

Various sensors can be implemented in electronic devices or systems to provide certain desired functions. There is an increasing need for securing access to computers and computer-controlled devices or systems where only authorized users be identified and be distinguished from non-authorized users. For example, mobile phones, digital cameras, tablet PCs, notebook computers and other portable electronic devices have become more and more popular in personal, commercial and governmental uses. Portable electronic devices for personal use may be equipped with one or more security mechanisms to restrict the access only to an authorized user in order protect the user's privacy or the information available on such a device. A computer or a computer-controlled device or system for an organization or enterprise may be secured to allow only authorized personnel to access to protect the information or the use of the device or system for the organization or enterprise.

The information stored in portable devices and computer-controlled databases, devices or systems, may be of certain characteristics that should be secured. For example, the stored information may be personal in nature, such as personal contacts or phonebook, personal photos, personal health information or other personal information, or confidential information for proprietary use by an organization or enterprise, such as business financial information, employee data, trade secrets and other proprietary information. If the security of the access to the electronic device or system is compromised, the data may be accessed by others that are not authorized to gain the access, causing loss of privacy of individuals or loss of valuable confidential information. Beyond security of information, securing access to computers and computer-controlled devices or systems also allow safeguard of the use of devices or systems that are controlled by computers or computer processors such as computer-controlled automobiles and other systems such as ATMs.

Safe guarding of the access to a device such as a mobile device or a system such as an electronic database and a computer-controlled system can be achieved in different ways such as using user passwords. A password, however, may be easily to be spread or obtained and this nature of passwords can reduce the level of the security. Moreover, a user needs to remember a password to use password-protected electronic devices or systems, and, if the user forgets the password, the user needs to undertake certain password recovery procedures to get authenticated or otherwise regain the access to the device. Unfortunately, in various circumstances, such password recovery processes may be burdensome to users and have various practical limitations and inconveniences.

User authentication on an electronic device or system may be carried out through one or multiple forms of biometric identifiers, which can be used alone or in addition to conventional password authentication methods. One form of biometric identifiers is a person's fingerprint pattern. Personal fingerprint identification can achieve user authentication for enhancing the data security while mitigating certain undesired effects associated with passwords. Various types of electronic devices or systems, including portable or mobile computing devices, may employ user authentication mechanisms to protect personal or other confidential data and prevent unauthorized access using personal fingerprint identification techniques. A fingerprint sensor can be built into the electronic device or system to read a user's fingerprint pattern as part of the authentication process so that the device or system can only be unlocked by an authorized user through authentication of the authorized user's fingerprint pattern.

Fingerprint sensing can be implemented by using different sensing technologies that capturing images of fingerprints, such as capacitive sensing of the valleys and ridges of a fingerprint, optical sensing based on optical imaging of the valleys and ridges of a fingerprint and ultrasound sensing based on different acoustic signals manifested by the valleys and ridges of a fingerprint.

SUMMARY

Disclosed are systems, devices and methods for providing fingerprint sensors based on ultrasound imaging techniques in electronic devices and fabrication techniques for producing ultrasound-based fingerprint sensors.

In some aspects, a method for fabricating an ultrasound fingerprint sensor device includes producing an intermediary protective structure including an array of bottom electrodes and an insulation layer on a base chip; forming a layer of an acoustic transducer material on the intermediary protective structure; producing transducer elements over the intermediary protective structure by dicing or etching the formed transducer material layer to create the transducer elements, in which the insulation layer includes a thickness such that portions of the intermediary protective structure incur loss without any damage occurring to the underlying base chip during the dicing or etching the formed layer of the acoustic transducer material; and producing top electrodes on the produced transducer elements.

In some aspects, an ultrasound fingerprint sensor device includes an intermediate layer coupled to a base chip including an integrated circuit having conducive contacts at a surface of the base chip, the intermediate layer including an insulation layer and bottom electrode structures coupled to the conductive contacts of the base chip, in which the intermediate layer is produced by: forming the insulation layer on the base chip, etching channels through the insulation layer at a position above conductive contacts of the base chip, and depositing conductive material in the etched channels to form the bottom electrodes, in which the bottom electrodes include an interface surface positioned at or above a top surface of the insulation layer; a plurality of ultrasonic transducer elements including an acoustic transducer material coupled to the bottom electrodes, in which the ultrasonic transducer elements are produced by: forming a layer of the acoustic transducer material on the intermediate layer, and producing transducer elements over the intermediate layer by dicing or etching the formed acoustic transducer material layer to create the transducer elements, in which the insulation layer includes a thickness such that portions of the intermediate layer incur loss without any damage occurring to the underlying base chip during the dicing or etching the formed layer of the acoustic transducer material; and a plurality of top electrodes positioned on the ultrasonic transducer elements, in which the top electrodes are produced by: coating a conductive material on the produced ultrasonic transducer elements.

In some aspects, an ultrasound fingerprint sensor device includes an intermediate layer coupled to a base chip including an integrated circuit having conducive contacts at a surface of the base chip, the intermediate layer including an insulation layer formed on the base chip and a corresponding array of channeling electrode structures coupled to the conductive contacts and passing through the insulation layer, in which the channeling electrodes terminate at or above a top surface of the insulation layer to provide bottom electrodes; a plurality of ultrasonic transducer elements including an acoustic transducer material coupled to the bottom electrodes; and a plurality of top electrodes positioned on the ultrasonic transducer elements.

Those and other aspects and their implementations are described in greater detail in the drawings, the description and the claims.

BRIEF DESCRIPTION OF THE DRAWINGS

FIGS. 5A-5D show illustrative diagrams depicting a method to fabricate a type A ultrasound fingerprint sensor device in accordance with the present technology.

FIGS. 7B-1 and 7B-2 show diagrams of an example embodiment of an acoustic receiver assembly of the type B ultrasound fingerprint sensor device shown in FIG. 7A.

FIGS. 7C-1 and 7C-2 show diagrams of an example embodiment of an acoustic transmitter assembly of the type B ultrasound fingerprint sensor device shown in FIG. 7A.

DETAILED DESCRIPTION

Disclosed are systems, devices and methods for providing fingerprint sensors based on ultrasound imaging techniques in electronic devices and fabrication techniques for producing ultrasound-based fingerprint sensors.

Figure 1:
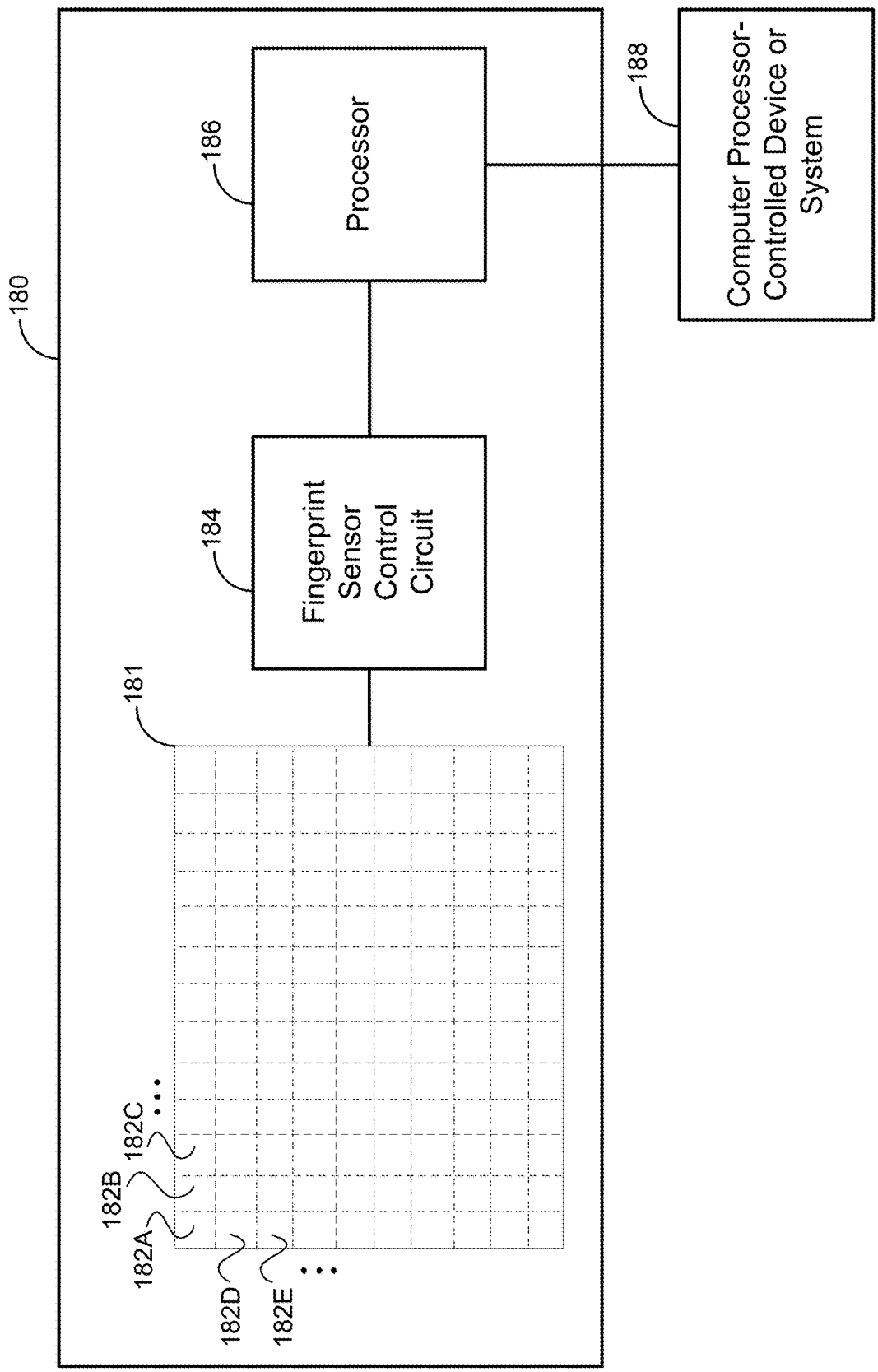
FIG. 1 shows a diagram of an electronic device interfaced with an example embodiment of a fingerprint identification device including an ultrasound fingerprint sensor in accordance with the present technology.

FIG. 1 shows a diagram of electronic device 188 interfaced with an example embodiment of a fingerprint identification device 180 including an ultrasound sensor to detect a fingerprint for identification of an authorized user of the electronic device 188. The fingerprint identification device 180 includes an ultrasound fingerprint sensor 181, a fingerprint sensor control circuit 184, and a digital processor 186 which may include one or more processors for processing fingerprint patterns and determining whether an input fingerprint pattern is one for an authorized user. The fingerprint identification device 180 uses the ultrasound fingerprint sensor 181 to obtain a fingerprint and compares the obtained fingerprint to a stored fingerprint to enable or disable functionality in a computer processor-controlled (electronic) device 188 that is secured by the fingerprint identification device 180. In some implementations, for example, the access to the electronic device 188 is controlled by the fingerprint processing processor 186 based on whether the captured user fingerprint is from an authorized user. As illustrated in the diagram of FIG. 1, the ultrasound fingerprint sensor 181 may include multiple fingerprint sensing regions or pixels such as regions or pixels 182A-182E that collectively represent at least a portion of a fingerprint.

For example, the fingerprint identification device 180 may be implemented at an automated teller machine (ATM) as the electronic device 188 to determine the fingerprint of a customer requesting to access funds or other transactions. Based on a comparison of the customer's fingerprint obtained from the fingerprint sensor 181 to one or more stored fingerprints, the fingerprint identification device 180 may, upon a positive identification, cause the ATM device 188 to grant the requested access to the user account; or, upon a negative identification, may deny the access. In another example, the electronic device 188 may be a smartphone or a portable computing device and the fingerprint identification device 180 is a module integrated with the electronic device 188. In another example, the electronic device 188 may be a gate or secured entrance to a facility or home that uses the fingerprint sensor 181 to grant or deny entrance. In yet another example, the electronic device 188 may be an automobile or other vehicle that uses the fingerprint sensor 181 to link to the start of the engine and to identify whether a person is authorized to operate the automobile or vehicle.

Figure 2A:
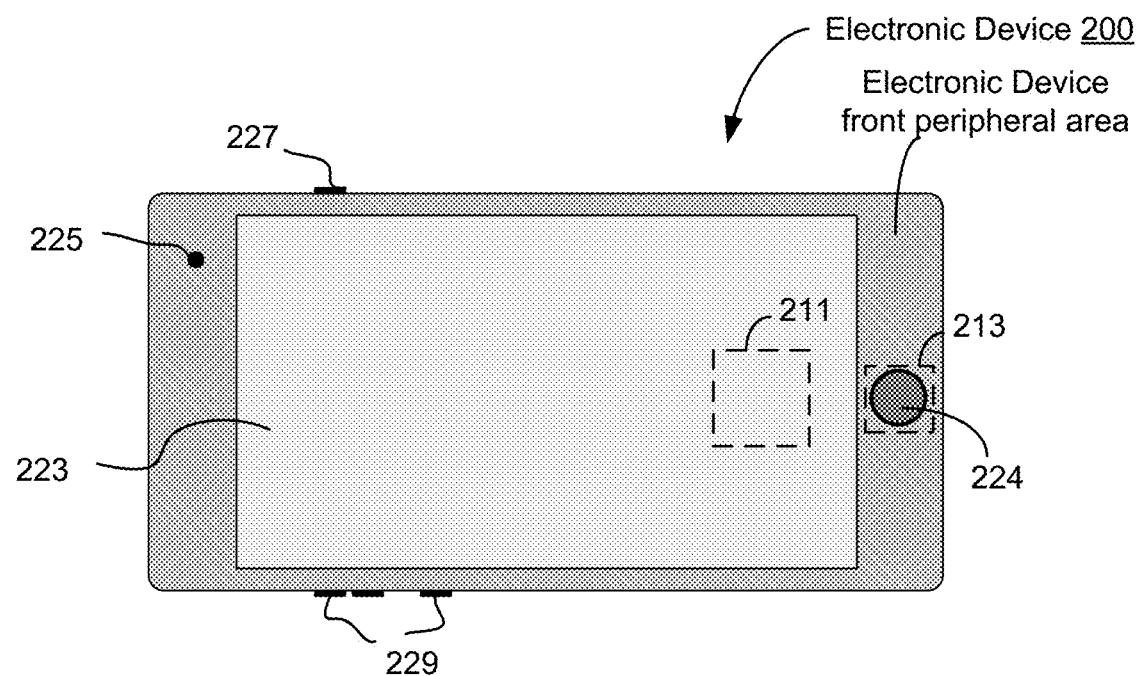
FIGS. 2A and 2B show diagrams of an example electronic device having a touch sensing display screen assembly and/or a touch sensing button assembly including a fingerprint identification device in accordance with the present technology.
Figure 2B:
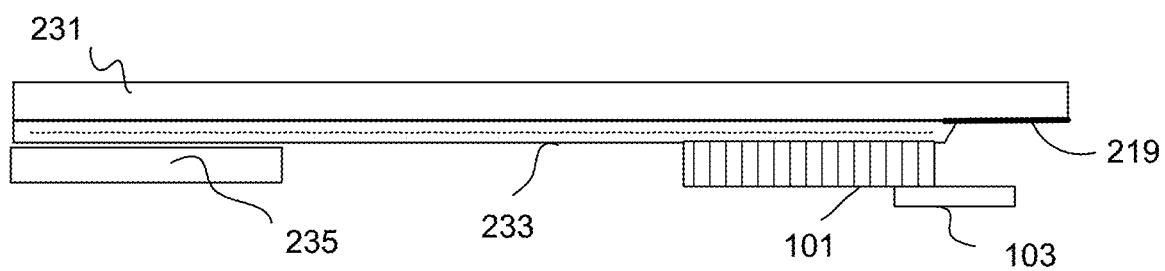

FIGS. 2A and 2B illustrate an example of an electronic device 200 having a touch sensing display screen assembly 223 and/or a touch sensing button assembly 224 including an example embodiment of the fingerprint identification device 180 including an ultrasound fingerprint sensor module 101 positioned underneath the touch sensing display screen assembly 223 and/or the touch sensing button assembly 224. In this illustrative example, the electronic device 200 can be a portable device such as a smartphone or a tablet as the electronic device 188 shown in FIG. 1.

FIG. 2A shows the front-side side of the electronic device 200, which may resemble some features in some existing smartphones or tablets. The electronic device 200 includes the touch sensing display screen assembly 223 including a display glass 231 and underlying display module 233 and electronics module 235, in which the touch sensing display screen assembly 223 can occupy occupying the entirety, a majority or a significant portion of the front-side space of the electronic device 200. As illustrated, the device housing of the electronics device 200 may have, in various implementations, side facets that support side control buttons 227, 229 that are common in various implementations smartphones on the market today. Also, one or more optional sensors 225 may be provided on any side including the front side of the electronics device 200 outside the device screen as illustrated on the electronic device housing in FIG. 2A.

The ultrasound fingerprint sensor module 101 can be positioned underneath the touch sensing display screen assembly 223 at, e.g., one or more sensing areas 211 for receiving a finger on the display screen of the electronic device 200. As an example, FIGS. 2A and 2B show the fingerprint sensing area 211 in the device screen for a finger to touch which may be illuminated as a visibly identifiable zone or area for a user to place a finger for fingerprint sensing for ultrasound sensing performed by the ultrasound fingerprint sensor module 101. Such a fingerprint sensing zone, in addition to providing the fingerprint sensing operation, can function like the rest of the device screen for displaying images. Additionally or alternatively, for example, the ultrasound fingerprint sensor module 101 can be positioned underneath a display edge or peripheral region at sensing area 213 for receiving and detecting a finger to obtain fingerprint information. As illustrated, the sensing area 213 is located in peripheral region outside the display area and can include a push button of the touch sensing button assembly 224 for receiving a finger on the push button of the electronic device 200. In implementations, for example, the ultrasound fingerprint sensor module 101 is positioned underneath the touch sensing display screen assembly 223 and/or the touch sensing button assembly 224 such that there are no gaps respective assembly and the sensor module 101.

FIG. 2B shows a diagram of example modules in the device 200 relevant to the ultrasound fingerprint sensor module 101 in accordance with embodiments of the present technology. The display screen assembly 223 shown in FIG. 2A includes a touch sensing screen module with touch sensing layers on the top, and a display screen module with display layers located underneath the touch sensing screen module. An example of the display screen assembly 223 includes the display cover 231 (e.g., cover glass) and underlying display module 233 and electronics module 235. In some implementations of the device 200, the device 200 includes a color layer positioned under the display cover 231. The ultrasound sensor module 101 is located underneath the top cover 231 of the device 200 and includes ultrasound transducer elements and circuitry for generating and sensing ultrasound signals. In various implementations, the ultrasound sensor module 101 is under the display screen assembly 223 to direct ultrasound to a fingerprint sensing area on the top cover 231 and to receive the reflected or returned ultrasound carrying the fingerprint image information. Coupled to the ultrasound fingerprint sensor module 101 is an ultrasound data processing module 103, e.g., including electronic circuits to control the generation and transmission of ultrasound signals by the ultrasound elements in the ultrasound fingerprint sensor module 101 and process the return acoustic signals received at the ultrasound fingerprint sensor module 101. In some implementations, the ultrasound data processing module 103 can be in communication with the device electronics module 235 to utilize digital data processing functionality of the electronics module 235.

In some implementations, the ultrasonic fingerprint sensor module 101 can be installed at sensing area 211 under the display for suitable display conditions, for example, for OLED or LCD display that all the display components are assembled without air gap layers. In some implementations, the ultrasonic fingerprint sensor module 101 can be installed at sensing area 213 under the display edge or under buttons for tactile user interface conditions, for example, for soft OLED/LCD display so that the fingerprint sensing ultrasound signals can be directed to pass through areas that are outside the soft display components that tend to damp the ultrasonic waves and thus adversely impact the ultrasound imaging operation. Certain display modules may include structures that may significantly dampen ultrasound signals and thus the ultrasound fingerprint sensor module 101 can be located to direct the ultrasound outside such structures. For example, some LCD displays include display components that are assembled with air gap layers which exhibit high resistance for ultrasonic wave propagation.

The ultrasound transducers in the ultrasound fingerprint sensor module 101 can be configured to operate in different configurations for ultrasound generation and for ultrasound sensing. For example, in one approach, referred to as "type A", the acoustic transducers of the ultrasound fingerprint sensor module 101 can be structured to function both as the acoustic wave source (acoustic transmitters) and as the returned acoustic signal receiver (acoustic receivers). In another approach, referred to as "type B", the ultrasound fingerprint sensor module 101 includes acoustic wave transmitters and returned acoustic signal wave receivers that are separate ultrasound transducers.

Some example characteristics of the type A and type B ultrasound fingerprint identification devices are described. For example, the type A ultrasound fingerprint devices include ultrasound fingerprint sensor transducers that are arranged in a sensing array and are built on an integrated circuit (IC) chip, such as a CMOS structured chip. For example, the electrodes for each transducer element are prepared on the chip. A single piece, or several large pieces, of ultrasonic transducer materials (e.g., a piezoelectric material) are bounded or coated onto the IC chip. Corresponding electrodes are connected. The transducer materials are diced or etched to render the discrete ultrasonic transducer elements. For example, this design can include a goal to realize proper resonant frequency. Gaps among the discrete ultrasonic transducer elements can be filled with an appropriate filler material, such as a proper epoxy. The top electrodes of the discrete ultrasonic transducers are then formed. According to the driving mode, each top electrode can include a single, or several, or a row, or a column of discrete ultrasonic transducer elements. When high voltage is applied to the transducers, ultrasonic waves are generated. For example, a low voltage circuit is connected to the transducers to receive the returned ultrasonic wave induced electric signals.

For the type B ultrasound fingerprint devices, for example, two ultrasound transducer layer structures are fabricated for generating the ultrasound signals and for sensing the ultrasound signals, respectively. For example, in some implementations, the top layer structure is the acoustic signal receiver having ultrasound sensing transducers to detect returned ultrasound signals and a separate bottom layer structure is the acoustic signal generator having ultrasound emitter transducers to generate the ultrasound signals towards the top sensing area. For example, the two ultrasound layer structures can be formed in a similar manner to produce the type B ultrasound fingerprint devices, but with modifications to particular processes as in this patent document. For example, the ultrasound fingerprint sensor transducers are built on a prepared IC chip, such as a CMOS structured chip. For example, the electrodes for each transducer element are prepared on the chip. A single piece, or several large pieces, of ultrasonic transducer materials (e.g., piezoelectric materials) are bounded or coated onto the prepared IC chip. Corresponding electrodes are connected. The transducer materials are diced or etched to render the discrete ultrasonic transducer elements. Gaps among the discrete ultrasonic transducer elements can be filled with an appropriate filler material, such as a proper epoxy. Top electrodes of the discrete ultrasonic transducers are then formed, in which each top electrode is designed according to the driving mode, e.g., each top electrode can include a single, or several, or a row, or a column of discrete ultrasonic transducer elements. This produced structure forms an assembled ultrasonic transducer array to be used as the ultrasound signal receiver.

For the type B approach, a second layer structure is produced to be arranged underneath the acoustic receiver layer structure. The second layer structure can include a single piece, or several large pieces of ultrasonic transducer materials (e.g., a piezoelectric material such as a piezoelectric crystal) that are bounded or coated onto an electrode chip. Corresponding electrodes are connected. Then the transducer materials are diced or etched into discrete ultrasonic transducer elements, e.g., bars. For example, a goal is to realize a proper resonant frequency. Gaps among the discrete ultrasonic transducer elements can be filled with an appropriate filler material, such as a proper epoxy. The top electrodes of the discrete ultrasonic transducers are formed. According to the driving mode, each top electrode can include single, or several, or a row, or a column of discrete ultrasonic transducer elements, typically include a row or a column of transducers. The second layer structure is bounded under the ultrasound signal receiver to act as ultrasonic wave source.

Figure 3:
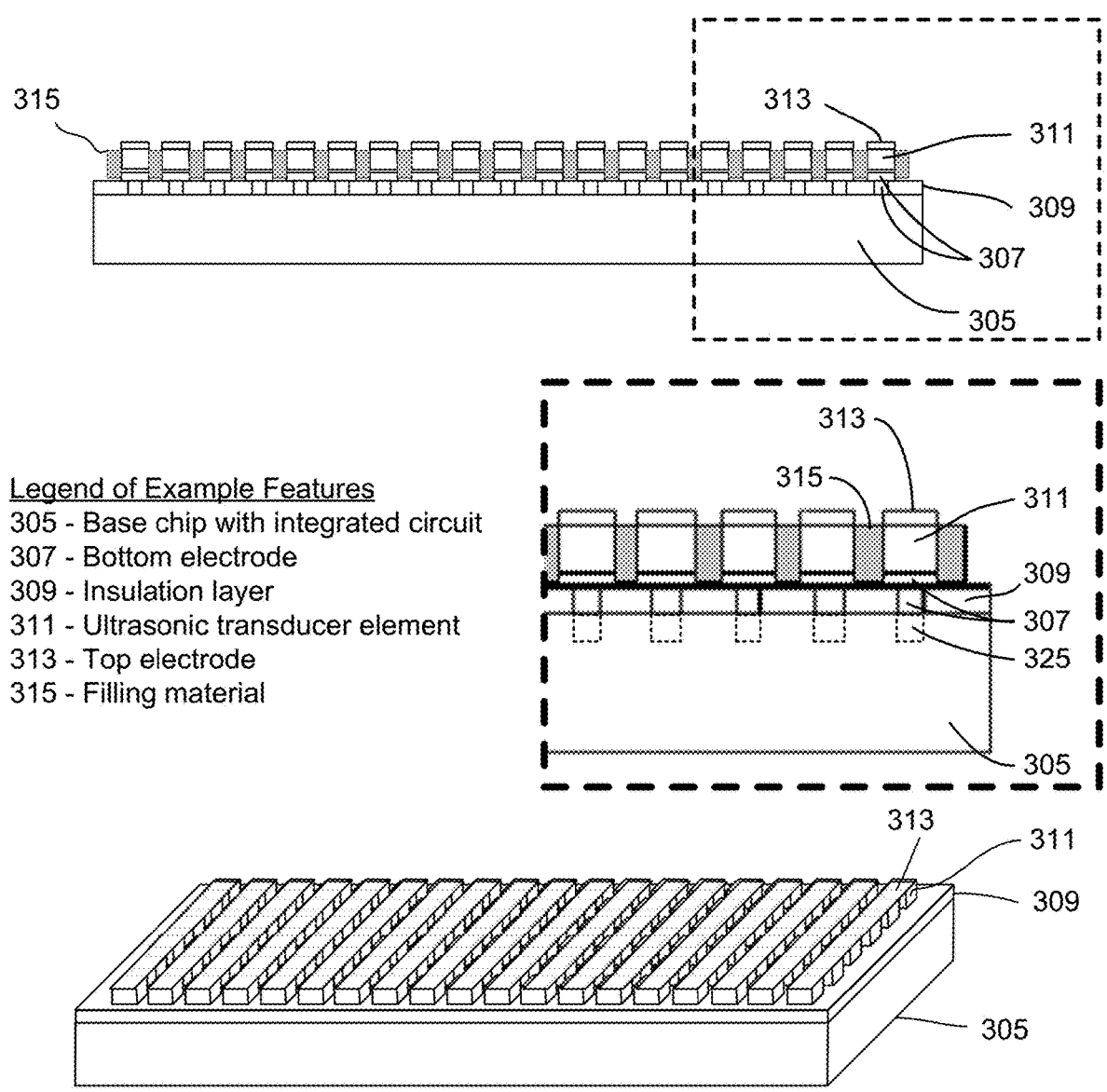
FIG. 3 shows a diagram depicting a two-dimensional side view and three-dimensional view of an example type A ultrasound fingerprint sensor device.

FIG. 3 shows a diagram depicting a two-dimensional side view and three-dimensional view of an example type A ultrasound fingerprint sensor device 300 where each ultrasound transducer element operates as both an emitter and a sensing receiver. The ultrasound sensor device 300 includes a base chip 305 with integrated circuit (e.g., CMOS structure, etc.) used as the platform of the ultrasound sensor device. In some implementations, for example, the base chip 305 includes an array of conductive contact points (e.g., electrodes) on the base chip surface, referred to as the base electrodes 325. The ultrasound sensor device 300 includes an insulation layer 309 on the base chip 305. In some implementations, for example, the insulation layer 309, e.g., silicon oxide ($SiO_2$), can be deposited and/or grown on the top surface of the base chip 305. The ultrasound sensor device 300 includes bottom electrodes 307 that extend from the base electrodes 325 of the base chip 305 and out to the surface (or beyond the surface) of the insulation layer 309. In some implementations, the insulation layer 309 is etched at locations directly above the base electrodes 325 and a thick conductive material is deposited to produce the bottom electrodes 307 that extend from the base electrodes 325 to at least the surface of the insulation layer 309. The ultrasound sensor device 300 includes ultrasonic transducer elements 311 including an acoustic transducer material such as a piezoelectric material that are bounded on the bottom electrodes 307. In some implementations, for example, an electrically conductive adhesive layer can be directly formed between the bottom electrodes 307 and the ultrasonic transducer elements 311; whereas in some implementations, the transducer elements 311 can be formed directly on the bottom electrodes 307 based on the materials selected for each respective component. For example, the electrically conductive adhesive layer can include Indium Tin Oxide, conductive polymer etc. can be coated to the electrodes, in which the electrically conductive adhesive material provides conductivity when the bottom electrodes 307 and the ultrasonic transducer elements 311 are in contact. In some embodiments, for example, the ultrasound sensor device 300 includes a filler material 315 (e.g., underfill material layer, such as epoxy) that is filled in the gaps between the acoustic transducer elements 311, e.g., over the insulation layer 309. The ultrasound sensor device 300 includes top electrodes 313 on the ultrasonic transducer elements 311. Each ultrasonic transducer element 311 is operated as both an emitter driven by a driver circuit and a sensing receiver driving by a separate receiver circuit.

Figure 4:
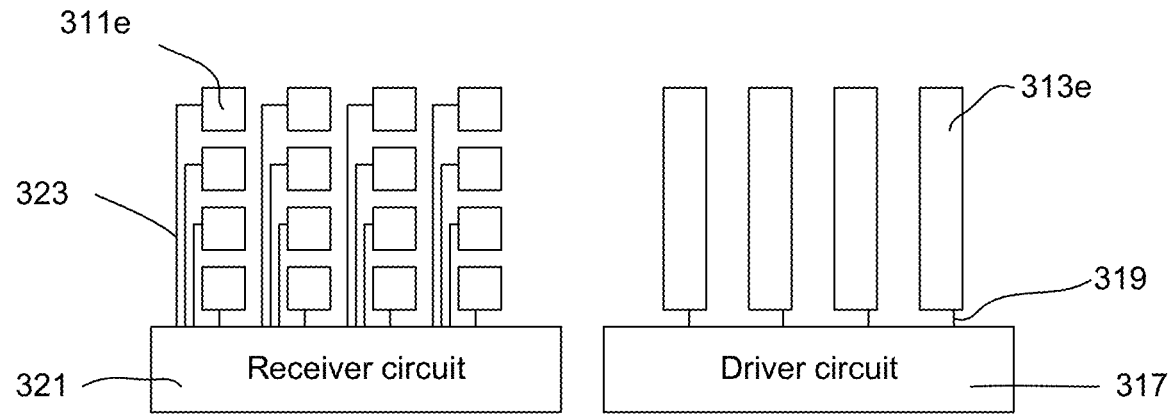
FIG. 4 shows a diagram of the example type A ultrasound fingerprint sensor device in communication with an electronic circuit.

FIG. 4 shows one example of the transmitter and receiver electrodes for the ultrasonic transducer elements 311 in the type A ultrasound fingerprint sensor device 300 in communication with an electronic circuit including an ultrasonic wave source driver to control acoustic transmission of the device 300 and an ultrasonic wave receiver to process the received return acoustic signals from the device 300. As shown in FIG. 4, the ultrasound fingerprint sensor device 300 is electrically coupled to a driver circuit 317 and a receiver circuit 321. The driver circuit 317 is connected to the top electrodes 313, e.g., shown in FIG. 4 as the top electrodes layer 313e, by connect wires 119 that extend between the driver circuit 317 and the top electrodes 313. In some embodiments, each top electrode 313 spans or includes a single, multiple, a row, or a column of the discrete ultrasonic transducer elements 311. In implementations, the driver circuit 317 drives the transducer element 311 to generate an acoustic pulse (probe acoustic wave) at desired high frequencies, such as 5 MHz to 40 MHz.

The receiver circuit 321 is connected to the discrete ultrasonic transducer elements 311 by connect wires 323 that extend between the receiver circuit 321 and the ultrasonic transducer electrodes 311. In implementations, for example, when a reflected acoustic wave arrives at a transducer element 311, the pressure caused by the returned acoustic wave stimulates the transducer element 311 to generate an electric signal, which is received at the receiver circuit 321. The probe acoustic wave and the returned signal acoustic wave are separated in time domain, e.g., the returned signal acoustic wave is delayed some time with respect to the probe pulse.

Figure 5A:
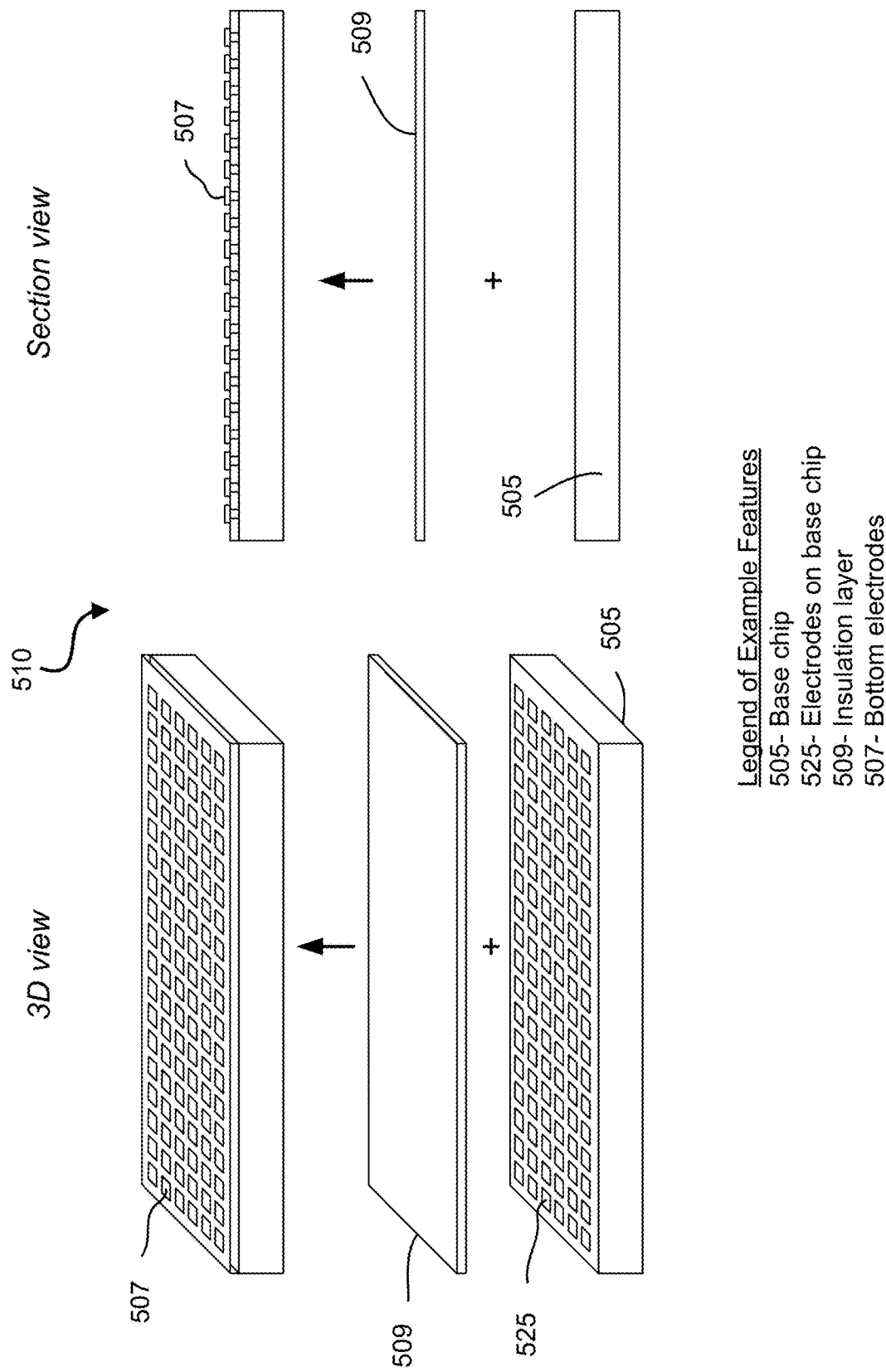
Figure 5B:
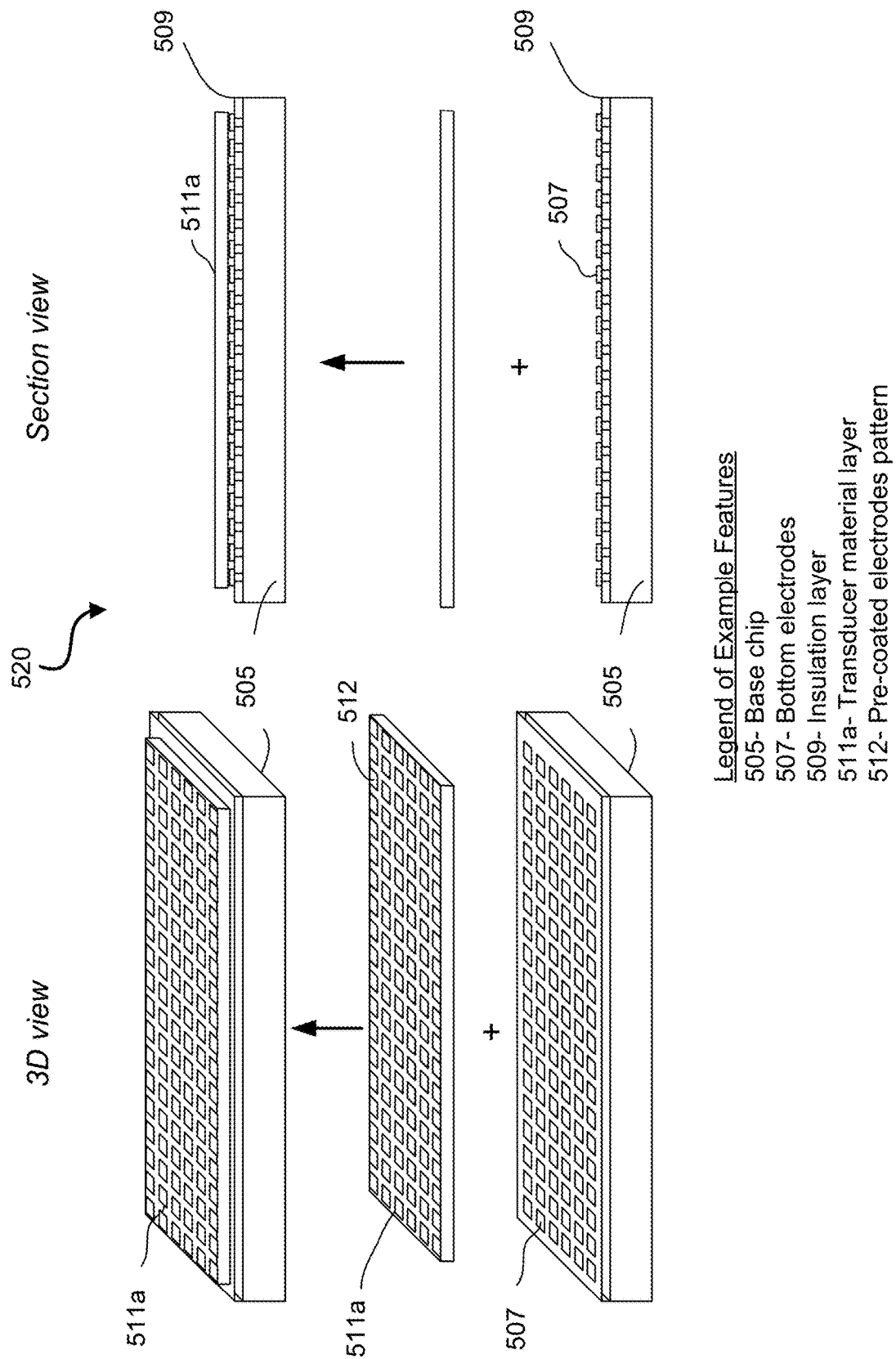
Figure 5D:
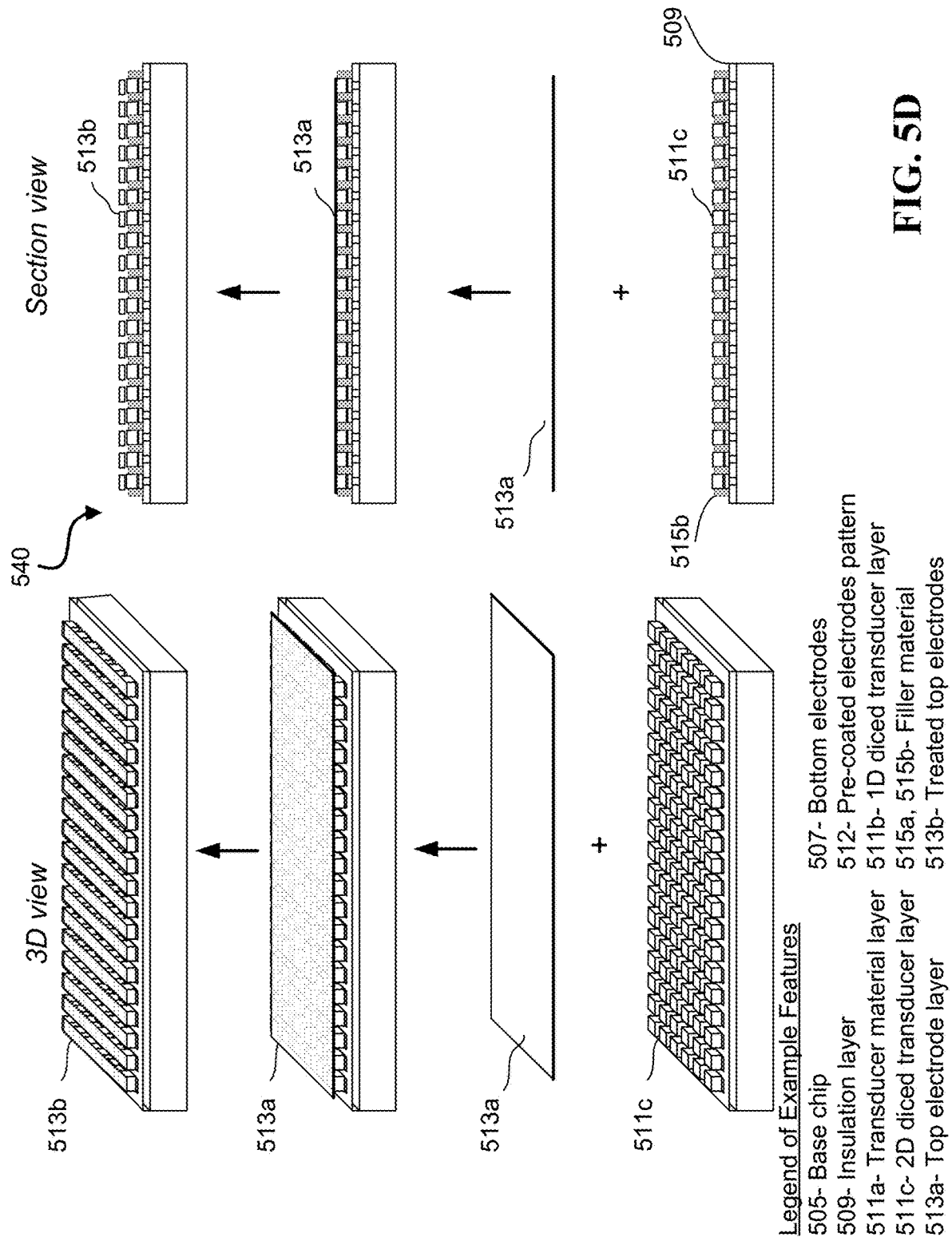

FIGS. 5A-5D show illustrative diagrams depicting an example of a method to fabricate a type A ultrasound fingerprint sensor device in accordance with the present technology. FIG. 5A shows a process 510 to prepare an intermediary protective structure including an array of electrodes and an insulation layer on a base chip 505, e.g., CMOS chip, of the ultrasound fingerprint sensor device. FIG. 5B shows a process 520 to produce a transducer material layer on the intermediary protective structure. FIG. 5C shows a process 530 to produce discrete transducer elements over the intermediary protective structure, in which portions of the protective structure (e.g., insulation layer) may incur loss or removal without any damage occurring to the underlying base chip. FIG. 5D shows a process 540 to form top electrodes on the produced transducer elements, and thereby produce the type A ultrasound fingerprint sensor device.

For example, the base chip 505 can include a microchip that has been integrated with a circuit including an integrated circuit, such as a CMOS processor, to be used as the platform of the ultrasound fingerprint sensor device 300. In some implementations, the base chip 505 depicted in FIG. 5A is a wafer including a plurality of base chips (e.g., CMOS devices). The base chip 505 includes electrodes 525 on the base chip 505.

As shown in FIG. 5A, the process 510 includes forming an insulation layer 509, such as $SiO_2$, on the base chip 505. In some implementations of the process 510, for example, the insulation layer 509 is grown on the base chip 505. The insulation layer 509 produced on the base chip 505 provides, for example, a protective layer or sacrificial layer (e.g., buffering material) for the following processes of the fabrication method, such as transducer layer dicing process. The process 510 includes producing bottom electrodes 507 of a conductive material that interfaces between the top of the insulation layer 509 and the electrodes 525 of the base chip 505. In some implementations of the process 510, for example, the bottom electrodes 507 are formed by etching the insulation layer 509 at the electrodes 525 position and depositing the conductive material in the etched regions to form the bottom electrodes 507.

The process 510 produces the protective structure (the bottom electrodes 507 and insulation layer 509 complex) over the base chip 505. In some embodiments, the protective structure can be produced to have a thickness of 0.1 µm to 10 The protective structure provides a sacrificial layer to the base chip 505 that essentially 'raises up' the electrical interface regions (e.g., electrodes 525) of the base chip 505 to safely form the discrete transducer elements that interface with the base chip 505 without any damage to the base chip 505. For example, the protective structure can serve as a buffer material to allow dicing, etching or any destructive fabrication technique to produce the transducer elements to the size, shape and other physical parameters as desired. In some implementations, an example thickness of the protective structure includes about 1 µm.

As shown in FIG. 5B, the process 520 includes producing a layer of a transducer material 511a, such as a piezoelectric material, on the protective structure over the base chip 505. For example, the layer of transducer material 511a is bounded onto the protective structure. In some implementations of the process 520, the producing the layer of transducer material 511a on the protective structure includes bonding the layer 511a. For example, the bonding can include gluing, soldering or other bonding approach. In some implementations, for example, the bonding can include depositing an electrically conductive adhesive layer that can be directly formed between the bottom electrodes 507 and the transducer material layer 511a. In some implementations, an underfill is provided to fill gaps between the transducer material 511a and the insulation layer 509, e.g., in cases where the bottom electrodes 507 protrude above the top plane of the insulation layer 509.

In implementations of the process 520, for example, the layer of transducer material 511a can be formed as a single piece, or multiple pieces. The top and bottom surfaces of the transducer material 511a may be prepared for electrode coatings. For example, in some implementations, the process 520 includes producing a pre-coated electrode patterns 512 on the layer of transducer material 511a. In some examples, the electrode patterns 512 are pre-coated on both top and bottom surfaces of the transducer material 511a. In case of an etching process, the electrodes material are typically that of metal.

As shown in FIG. 5C, the process 530 includes producing discrete transducer elements 511b or 511c by dicing or etching (e.g., laser etching) structures into the layer of transducer material 511a, e.g., as a row or a column of transducers elements 511b or as a two-dimensional array of transducer elements 511c. In some implementations, for example, the transducer layer 511a may be diced or etched in one dimension to form transducer bars 511b. The insulation layer 509 can be used as buffer during the dicing or etching process. The process 530 includes filling gaps (e.g., in the diced or etched regions between the transducer bars 511b) with a filling material 515. For example, the filling material 515 can be selected and added based on the desired response frequency of the fabricated device.

In some implementations, for example, the transducer layer 511a may be diced or etched in two dimensions to form transducer elements 511c. In such implementations, the process 530 includes filling the gaps in the diced or etched regions between the transducer bars 511b, with the filling material 515, and repeating the dicing or etching processes in a different (e.g., perpendicular) direction to the transducer bars 511b to produce two-dimensional array of transducer elements 511c. The process 530 includes filling gaps in the diced or etched regions between the transducer elements 511c with the filling material 515. For example, the filling material 515 can be selected and added based on the desired response frequency of the fabricated device.

In some embodiments, for example, the filling material 515 includes an epoxy, a gel, air or other suitable filling material. By adding the filling material 515 after the dicing or etching of the transducer layer 511a and/or the transducer bars 515b, for example, the fabrication method enhances the robustness of the produced ultrasound fingerprint sensing device without affecting the transducer response.

As shown in FIG. 5D, the process 540 to form top electrodes includes coating a top electrode layer 513a on the formed ultrasound transducer elements 511b or 511c. The layer that forms the top electrode structure 513 is provided to create the acoustic transmission control features for generating an acoustic probe wave (e.g., ultrasound wave sources) by the fabricated device. In implementations, for example, the top electrode layer 513a provides a flexible layer to reduce or eliminate damping of the acoustic signal.

In some implementations of the process 540, the top electrode layer 513a may be treated in one dimension to form a bar structure 513b. In some implementations of the process 540, the top electrode layer 113a may be treated in other pattern. In some embodiments, the formed top electrode structure 513 includes a planar structure (e.g., like the electrode layer 513a), a bar structure (e.g., like the top electrode bars 513b), or an array of two dimensionally-diced/etched elements that span across a single, multiple, a row, or a column transducer elements.

Figure 6:
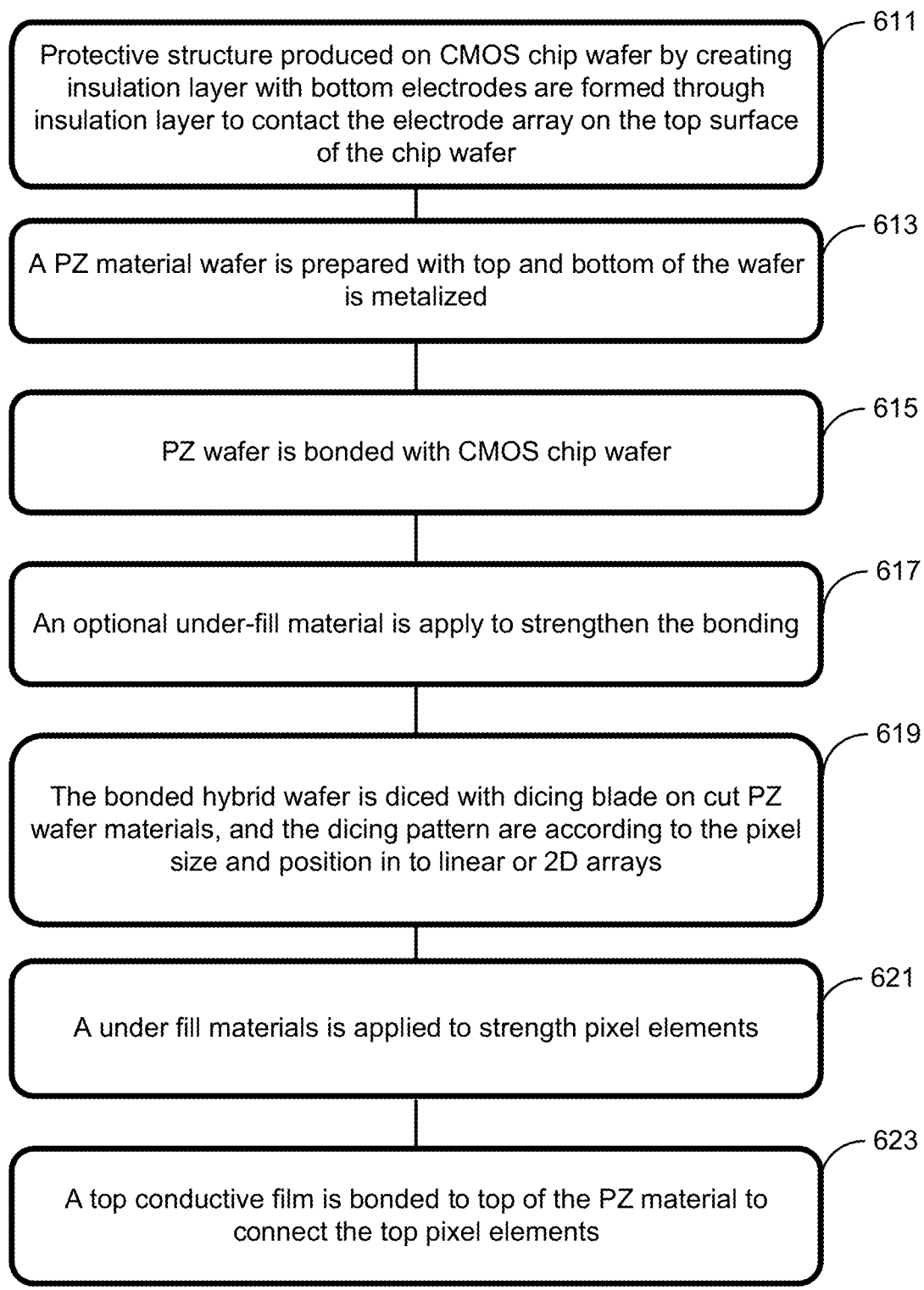
FIG. 6 shows a block diagram of an example embodiment of the fabrication method in accordance with the method shown in FIGS. 5A-5D for fabricating a type A ultrasound fingerprint sensor device.

FIG. 6 shows a block diagram of an example embodiment of the fabrication method in accordance with the method shown in FIGS. 5A-5D for fabricating a type A ultrasound fingerprint sensor device. As shown in FIG. 6, the fabrication method includes, at box 611, producing a protective structure on a circuit device, e.g., CMOS chip wafer, by creating an insulation layer on the integrated circuit device and forming bottom electrodes through selected regions of the insulation layer to contact a connection site, e.g., such as an electrode array, on the top surface of the example CMOS chip wafer. The fabrication method includes, at box 613, preparing a piezoelectric material wafer, in which the top and bottom of the piezoelectric material wafer is metalized. The fabrication method includes, at box 615, bonding the piezoelectric material wafer to the CMOS chip wafer. In some implementations, the fabrication method optionally includes, at box 617, applying an under-fill material to strengthen the bonding of the piezoelectric material wafer and the CMOS chip wafer. The fabrication method includes, at box 619, dicing the piezoelectric-CMOS-bonded wafer, e.g., with a dicing blade, to form an array of piezoelectric transducers. For example, the piezoelectric-CMOS-bonded hybrid wafer can be diced to cut piezoelectric wafer materials based on a dicing pattern according to a desired pixel size and position to produce a linear or two dimensional array of transducer elements. In some implementations, the fabrication method optionally includes, at box 621, applying an under-fill material, e.g., to strengthen the pixel elements. The fabrication method includes, at box 623, bonding a top conductive film to the top of the piezoelectric material to connect the pixel elements.

In the above examples for fabricating the type A ultrasound transducer elements, a full layer of a suitable piezoelectric material stack is first formed and is then subsequently processed into individual transducer elements. This process provides a wafer level processing of all transducer elements at the same time to ensure uniform processing of all transducer elements and to avoid an expensive, time consuming process of first assembling individual transducer elements and then tiling assembled individual transducer elements into an array format. The fabrication methods to produce ultrasound sensor devices disclosed in this patent document are scalable for mass production of ultrasound sensor devices that can be produced for any applications. The described processes allow for direct fabrication on a wafer, e.g., wafer having multiple CMOS devices, in which each layer of the ultrasound sensor device is produced simultaneously for each base CMOS device. For example, in this manner, the ultrasound transducer elements are produced simultaneously and uniformly for each ultrasound sensor device to be produced on the wafer. In contrast, for example, conventional techniques to create ultrasound sensor devices require the transducer elements to be assembled on the device structure individually and non-uniformly. These conventional techniques are not scalable for mass production of such devices, and thereby impede the advancement and widespread adoption of an entire class of acoustic sensors. Moreover, these conventional techniques risk compounding errors during the fabrication process due to the serial nature of assembling individual components to produce the ultrasonic transducer pixels of the device.

Figure 7A:
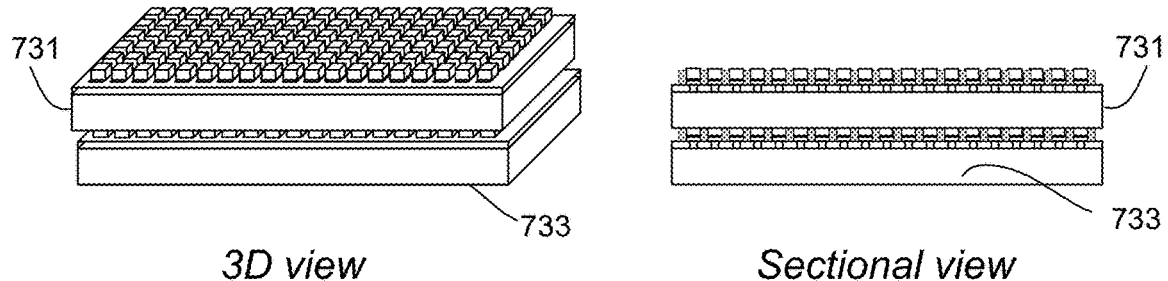
FIG. 7A shows a diagram depicting a two-dimensional side view and three-dimensional view of an example type B ultrasound fingerprint sensor device.

FIG. 7A shows a diagram depicting a two-dimensional side view and three-dimensional view of an example type B ultrasound fingerprint sensor device 700. The ultrasound sensor device 700 includes an acoustic transmitter assembly 733 and an acoustic receiver assembly 731. The acoustic receiver assembly 731 is coupled to the acoustic transmitter assembly 733. For example, in some embodiments the acoustic transmitter assembly 733 is bonded to the acoustic receiver assembly 731. In some embodiments, the acoustic receiver assembly 731 includes embodiments of the type A ultrasound fingerprint sensor device 300 that includes a piezoelectric material with a lower Q factor than the piezoelectric material of the acoustic transmitter assembly 733.

As shown in FIG. 7A, the acoustic receiver assembly 731 is coupled to and positioned above the acoustic transmitter assembly 733 to form the ultrasonic fingerprint sensor device 700. Yet, in some embodiments, for example, the positioning of the acoustic receiver assembly 731 and the acoustic transmitter assembly 733 can be reversed, in which the acoustic receiver assembly 731 is coupled to and positioned below the acoustic transmitter assembly 733 to form the ultrasonic fingerprint sensor device 700.

Figures 1, 7B:
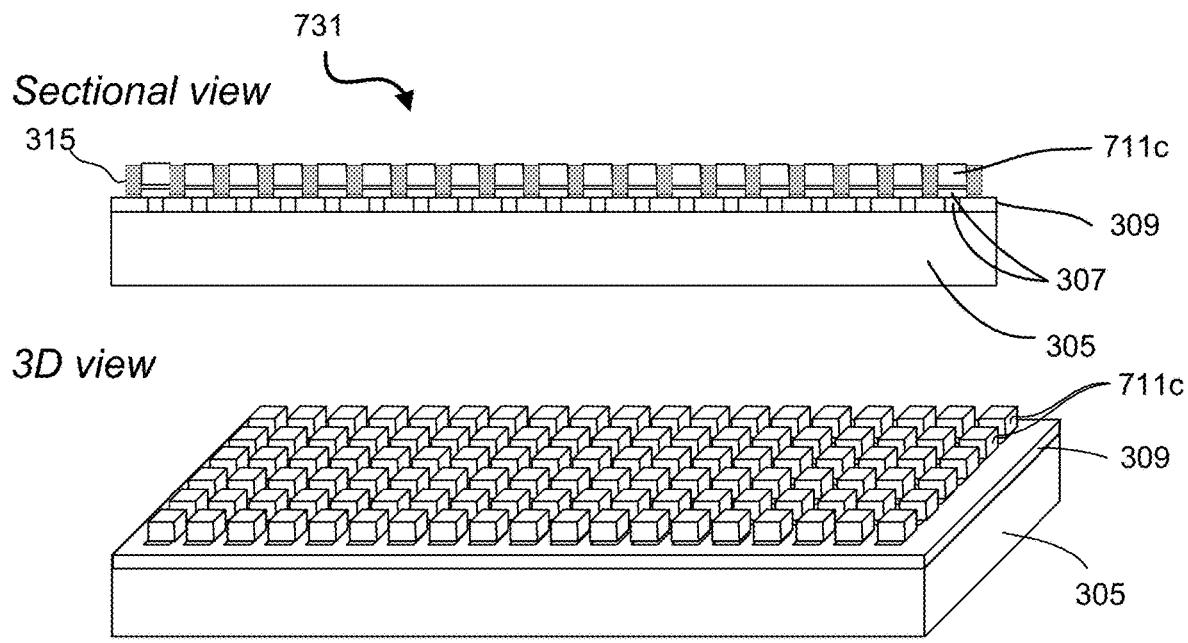

FIG. 7B-1 shows a diagram depicting a two-dimensional side view and three-dimensional view of an example embodiment of the acoustic receiver assembly 731 of the type B ultrasound fingerprint sensor device 700 shown in FIG. 7A. For example, the acoustic receiver assembly 731 can be fabricated according to the method described in FIGS. 5A-5C with respect to the type A ultrasound fingerprint sensor devices, except without formation of the top electrode layer. For example, as a receiver, the function of the acoustic receiver assembly 731 is to receive returned acoustic signals from the target volume, e.g., the finger interfaced with the fingerprint sensor areas. In some implementations, the transducer material 311a can be selected to be very sensitive to the ultrasound frequencies to produce the ultrasonic transducer elements 711c. For example, a coating process may be applied to form the transducer layer 311a.

As shown in FIG. 7B-1, the acoustic receiver assembly 731 includes the base chip 305 with integrated circuit (e.g., CMOS) used as the platform of the ultrasound sensor device 700. The acoustic receiver assembly 731 includes the protective layer (e.g., the insulation layer 309 with the bottom electrodes 307 extending from the base electrodes 325 of the base chip 305 and out/beyond the surface of the insulation layer 309). The acoustic receiver assembly 731 includes ultrasonic transducer elements 711c including an acoustic transducer material bounded on the bottom electrodes 307 and the filler material 315 filled in the gaps between the acoustic transducer elements 711c.

Figures 2, 7B:
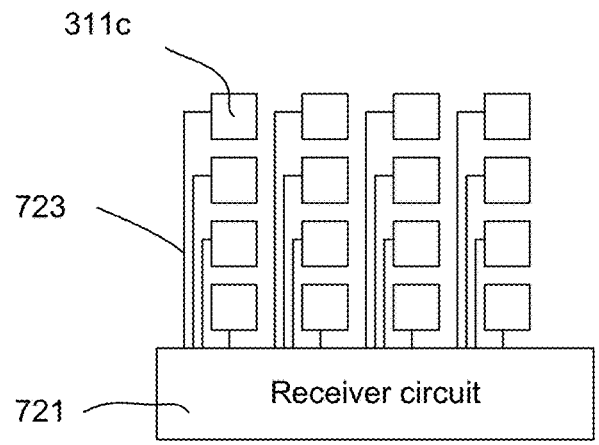

FIG. 7B-2 shows a diagram of the acoustic receiver assembly 731 in electrical communication with an electronic circuit 721 to process the signals produced by the acoustic receiver assembly 731, referred to as the receiver circuit 721. The acoustic receiver assembly 731 is electrically connected to the receiver circuit 721 via interconnect lines 723, e.g., wires.

Figures 1, 7C:
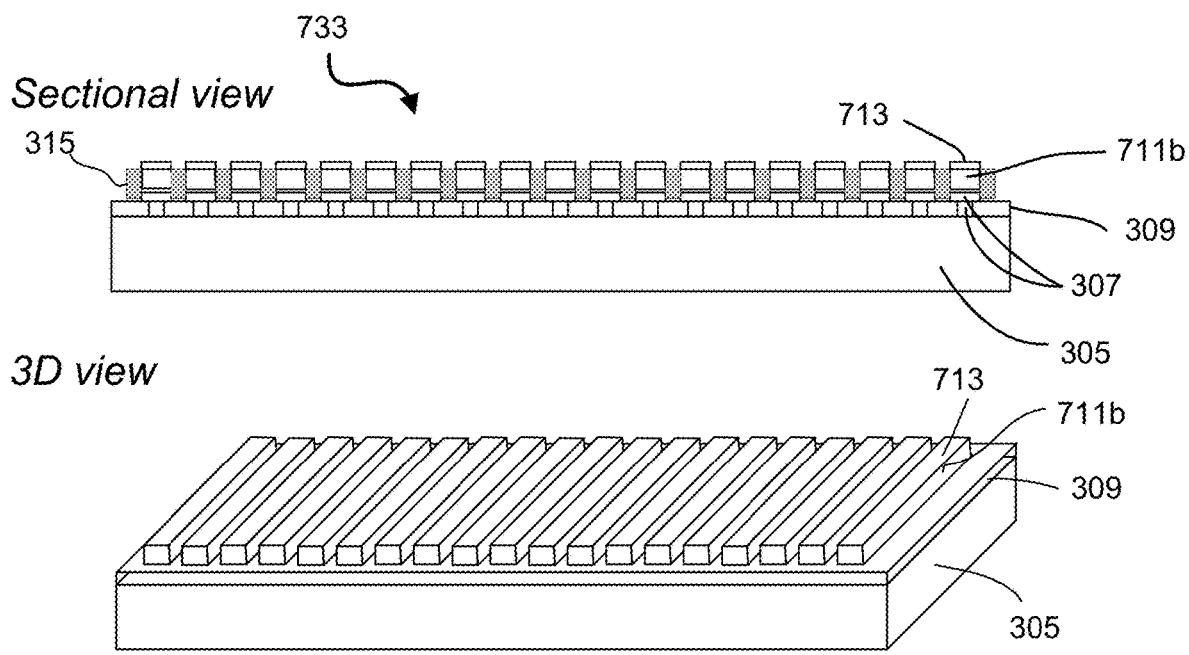
Figures 2, 7C:
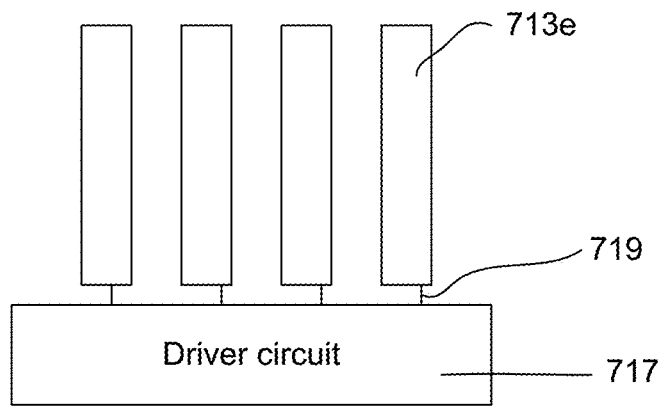

FIG. 7C-1 shows a diagram depicting a two-dimensional side view and three-dimensional view of an example embodiment of the acoustic transmitter assembly 733 of the type B ultrasound fingerprint sensor device 700 shown in FIG. 7A. For example, the acoustic transmitter assembly 733 can be fabricated according to the method described in FIGS. 5A-5D with respect to the type A ultrasound fingerprint sensor devices, in which the top electrode layer 713 is produced on the transmitter assembly 733, e.g., which can span to cover a single, multiple, a row, a column, or whole body of the transmitter transducer. For example, as a transmitter, the function of the acoustic transmitter assembly 733 is to generate acoustic probe signals to interrogate the target volume, e.g., the finger interfaced with the fingerprint sensor areas. In some implementations, the transducer material 311a can be selected to be very powerful to send out the acoustic waves at desired frequencies. For example, a crystal material may be used to form the transducer layer 311a to produce the transducer bars 711b.

In some implementations, a method to fabricate a type B ultrasound fingerprint sensor device includes producing an intermediary protective structure including an array of bottom electrodes and an insulation layer on a base chip, e.g., in accordance with any of the examples described for the process 510. The method includes forming a layer of an acoustic transducer material on the intermediary protective structure, e.g., in accordance with any of the examples described for the process 520. The method includes producing transducer elements over the intermediary protective structure, e.g., by dicing or etching the formed transducer material layer to create the transducer elements, in which the insulation layer includes a thickness such that portions of the intermediary protective structure incur loss without any damage occurring to the underlying base chip during the dicing or etching the formed layer of the acoustic transducer material. The transducer elements can be produced in accordance with any of the examples described for the process 530. The method includes attaching a second base chip to the produced transducer elements. The method includes producing a second intermediary protective structure including an array of second bottom electrodes and a second insulation layer on the second base chip, e.g., in accordance with any of the examples described for the process 510. The method includes forming a second layer of an acoustic transducer material on the second intermediary protective structure, e.g., in accordance with any of the examples described for the process 520. The method includes producing second transducer elements over the second intermediary protective structure, e.g., by dicing or etching the formed second transducer material layer to create the second transducer elements, in which the second insulation layer includes a thickness such that portions of the second intermediary protective structure incur loss without any damage occurring to the underlying second base chip during the dicing or etching the formed second layer of the acoustic transducer material. The second transducer elements can be produced in accordance with any of the examples described for the process 530. The method includes producing top electrodes on the second transducer elements.

FIG. 7C-2 shows a diagram of the acoustic transmitter assembly 733 in electrical communication with an electronic circuit 717 to control the acoustic transmitter assembly 733 to generate the acoustic probe signals, referred to as the transmitter circuit 717. The acoustic transmitter assembly 733 is electrically connected to the transmitter circuit 717 via interconnect lines 719, e.g., wires.

Figure 8:
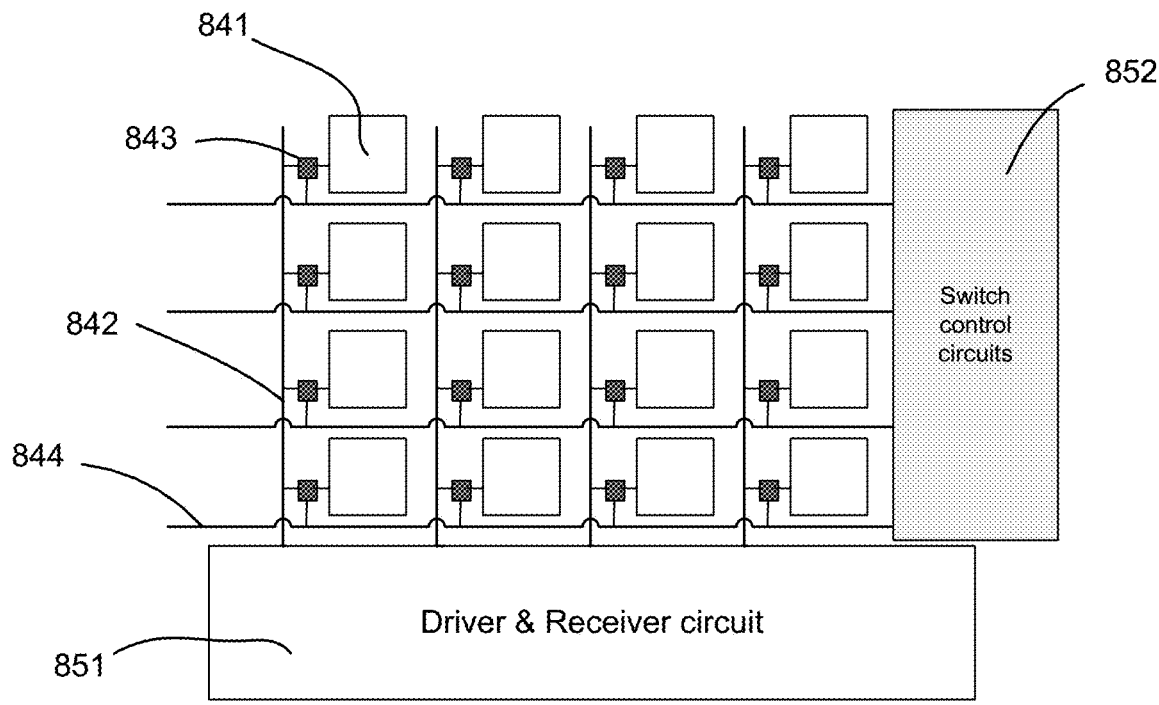
FIG. 8 shows a diagram of an example C type ultrasonic fingerprint sensor device including a multiplexed driver and receiver architecture for controlling the transmission and reception functionalities of an A type ultrasound fingerprint sensor.

FIG. 8 shows a diagram of an example C type ultrasonic fingerprint sensor device including a multiplexed driver and receiver architecture for controlling the transmission and reception functionalities of an A type ultrasound fingerprint sensor. In this example, the C type ultrasound fingerprint sensor is fully integrated the base chip 305 (e.g., CMOS chip), and includes driver and receiver circuit 851 and switching elements 843 to connect the driver and receiver circuit 851 to transducer elements of the ultrasound fingerprint sensor device, shown as transducer elements 841 in FIG. 8. For example, inside the driver and receiver circuit block 851, there are multiplex elements to connect either driver or receiver to the transducer connection bus 842. For example, the transducer elements 841 can be fabricated as previously described, e.g., with a common top electrode.

Figure 9:
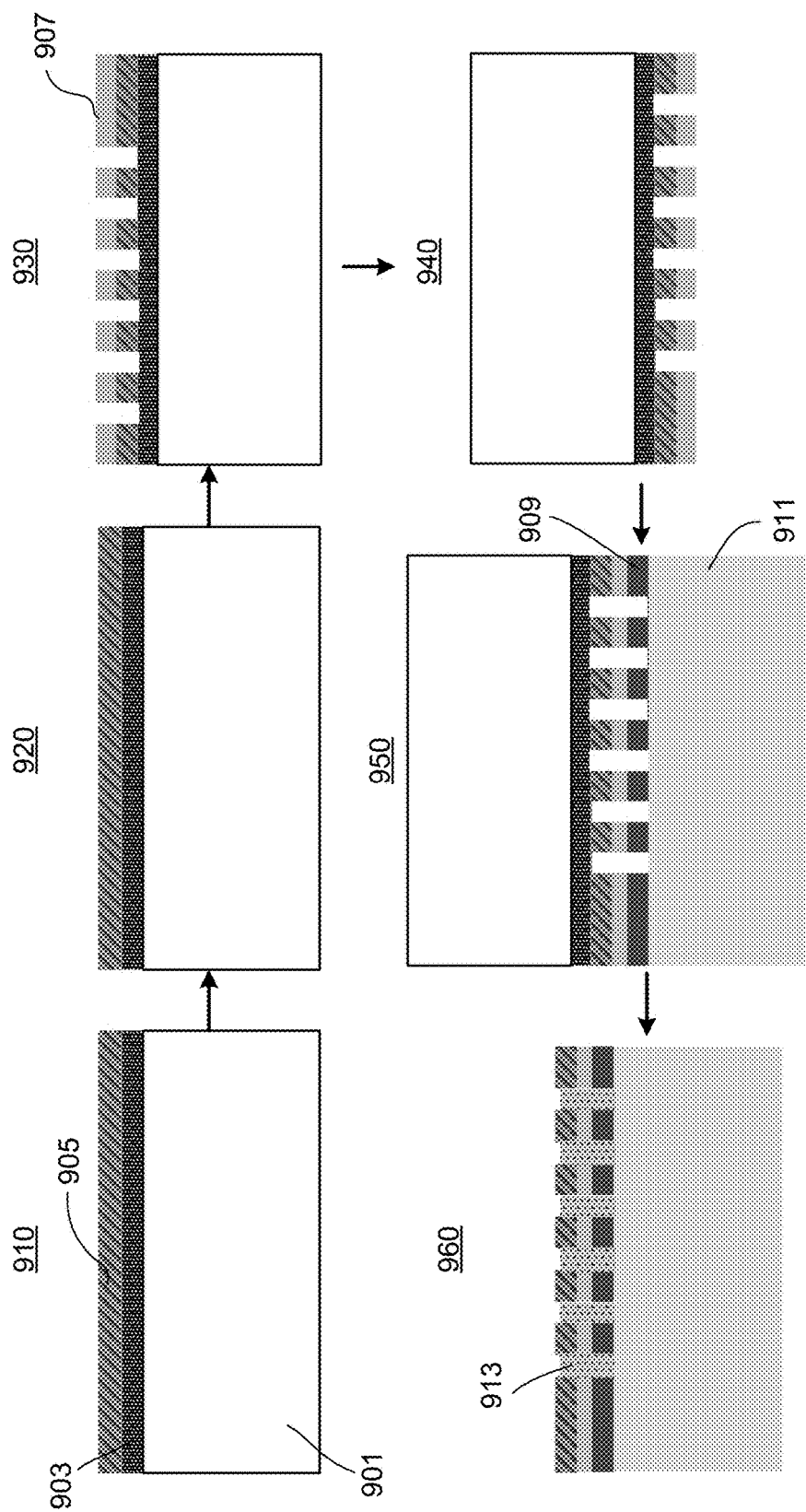
FIG. 9 shows illustrates another example of an etching process for a mass production method to produce ultrasound sensor devices.

FIG. 9 shows an illustrative diagram depicting a mass production method to produce ultrasound sensor devices that includes a modified etching process. The method includes a process 910, in which a piezoelectric material 905 (e.g., AlN, PZT, etc.) is bonded on a carrier wafer 901 (e.g., Si, glass, etc.) with temporary adhesive 903 (e.g., temporary bonding glue). The method includes a process 920, in which the piezoelectric material 905 is polarized with high E-field. The method includes a process 930, in which an electrode material 907 (e.g., Cu, Cu/Sn, Au, etc.) is grown on top of the piezoelectric material 905 to form a planned pattern, and then the electrode and piezoelectric material complex is etched to produce discrete transducer elements. For example, the temporary adhesive 903 (e.g., temporary bonding glue) also acts as buffer layer during the etching procedure. The method includes a process 940, in which the etched piezoelectric wafer is aligned and bonded onto a device wafer 911 (e.g., CMOS). For example, the device wafer 911 includes integrated circuits and has been prepared with corresponding electrode pattern on its surface. The method includes a process 950, in which the carrier wafer 901 is removed. In some implementations, for example, the gaps are filled with an appropriate material to enhance the device strength in a process 960. After the etching procedure, for example, other treatment steps may be added, such as to form common electrode on top of the transducers.

Figure 10:
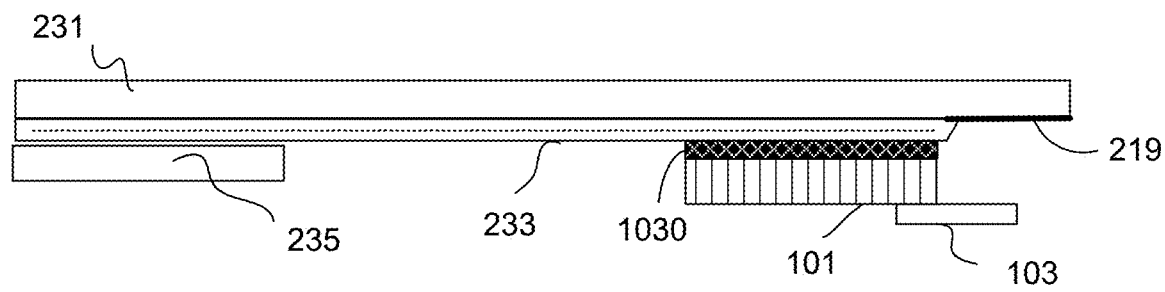
FIG. 10 shows a diagram of an example electronic device having a touch sensing display screen assembly and/or a touch sensing button assembly including a fingerprint identification device and time delay layer in accordance with the present technology.

FIG. 10 shows a diagram of another example embodiment of the device shown in FIG. 2B, labeled device 1000 in FIG. 10, in accordance with embodiments of the present technology. The device 1000 includes the touch sensing display screen assembly 223 including the display cover 231 (e.g., cover glass) and underlying display module 233 and electronics module 235, in which the ultrasound sensor module 101 is located underneath a time delay layer 1030 arranged between the underlying display module 233 and the ultrasound sensor module 101. In various implementations, the time delay layer 1030 provides a material under the display screen assembly 223 to delay the transmitted ultrasound signals and the returned ultrasound signals reflected form the surface, which a finger can contact, e.g., carrying the fingerprint image information. For example, the time delay layer 1030 can include a thin-film material, or in some embodiments multiple thin-film materials coupled together, to provide a predetermined impedance to ultrasonic signals propagating in the time delay layer 1030, thereby producing a certain time delay. In some implementations, the time delay layer 1030 is configured of a particular material or materials and of a certain thickness to provide the predetermined acoustic impedance to produce the time delay of the ultrasonic signals between the fingerprint contact region (e.g., display cover glass 231 and display module 233) and the ultrasound sensor module 101. The ultrasound fingerprint sensor module 101 is coupled to the ultrasound data processing module 103, e.g., including electronic circuits, to control the generation and transmission of ultrasound signals by the ultrasound elements in the ultrasound fingerprint sensor module 101 and process the return acoustic signals received at the ultrasound fingerprint sensor module 101 with the time delay.

EXAMPLES

In an example embodiment in accordance with the present technology (example 1), an ultrasound fingerprint sensor device includes an intermediate layer coupled to a base chip including an integrated circuit having conducive contacts at a surface of the base chip, the intermediate layer including an insulation layer formed on the base chip and a corresponding array of channeling electrode structures coupled to the conductive contacts and passing through the insulation layer, in which the channeling electrode structures terminate at or above a top surface of the insulation layer to provide bottom electrodes; a plurality of ultrasonic transducer elements including an acoustic transducer material coupled to the bottom electrodes; and a plurality of top electrodes positioned on the ultrasonic transducer elements.

Example 2 includes the device of example 1, further including a filler material that is filled in gaps between the ultrasonic transducer elements over the insulation layer.

Example 3 includes the device of example 2, in which the filler material includes one or more of an epoxy or a gel.

Example 4 includes the device of example 1, in which the acoustic transducer material includes a piezeoelectric crystal including lead zirconate titanate (PZT), aluminum nitride (AlN), gallium phosphate, quartz, tourmaline, lead magnesium niobate-lead titanate (PMN-PT).

Example 5 includes the device of example 1, in which the base chip includes a CMOS device.

Example 6 includes the device of example 1, in which the insulation layer includes silicon oxide.

Example 7 includes the device of example 1, in which the plurality of ultrasonic transducer elements include a two-dimensional array of transducer elements, in which each transducer element of the array is positioned above a respective bottom electrode.

Example 8 includes the device of example 1, in which the plurality of ultrasonic transducer elements include a one-dimensional array of transducer elements positioned above a group of the bottom electrodes.

Example 9 includes the device of example 1, in which the ultrasound fingerprint sensor device is operable to transmit an acoustic probe signal toward a target volume and receive a return acoustic signal reflected from the target volume at the plurality of ultrasonic transducer elements, in which the top electrodes are coupled to a driver circuit to control actuation of the ultrasonic transducer elements to generate the acoustic probe signal, and in which ultrasonic transducer elements are coupled to a receiver circuit to process the received return acoustic signal.

Example 10 includes the device of example 1, in which the ultrasound fingerprint sensor device is operable to transmit an acoustic probe signal toward a target volume, in which the top electrodes are coupled to a driver circuit to control actuation of the ultrasonic transducer elements to generate the acoustic probe signal, the device further including a plurality of second ultrasonic transducer elements including an acoustic transducer material positioned underneath the base chip; and a second intermediate layer coupled to a second base chip including a second integrated circuit having second conducive contacts at a surface of the second base chip, the second intermediate layer including a second insulation layer formed on the second base chip and a corresponding array of second channeling electrode structures coupled to the second conductive contacts and passing through the second insulation layer, in which the second channeling electrode structures terminate at or above a top surface of the second insulation layer to provide second bottom electrodes, and in which the second electrodes are coupled to the second ultrasonic transducer elements.

In an example embodiment in accordance with the present technology (example 11), a method for fabricating an ultrasound fingerprint sensor device includes producing an intermediary protective structure including an array of bottom electrodes and an insulation layer on a base chip; forming a layer of an acoustic transducer material on the intermediary protective structure; producing transducer elements over the intermediary protective structure by dicing or etching the formed transducer material layer to create the transducer elements, in which the insulation layer includes a thickness such that portions of the intermediary protective structure incur loss without any damage occurring to the underlying base chip during the dicing or etching the formed layer of the acoustic transducer material; and producing top electrodes on the produced transducer elements.

Example 12 includes the device of example 11, in which the insulation layer includes silicon oxide.

Example 13 includes the method of example 11, in which the acoustic transducer material includes a piezeoelectric crystal including lead zirconate titanate (PZT), aluminum nitride (AlN), gallium phosphate, quartz, tourmaline, lead magnesium niobate-lead titanate (PMN-PT).

Example 14 includes the method of example 11, in which the base chip includes a CMOS device.

Example 15 includes the method of example 11, further including adding a filler material in gaps between the produced transducer elements over the insulation layer.

Example 16 includes the method of example 15, in which the filler material includes one or more of an epoxy or a gel.

Example 17 includes the method of example 11, in which the producing the intermediary protective structure includes: forming the insulation layer on the base chip; etching channels through the insulation layer at a position above conductive contacts of the base chip; and depositing conductive material in the etched channels to form the bottom electrodes, in which the bottom electrodes include an interface surface positioned at or above a top surface of the insulation layer.

Example 18 includes the method of example 11, in which the forming the layer of the acoustic transducer material includes bonding the layer including one or more of gluing or soldering.

Example 19 includes the method of example 11, in which the layer of acoustic transducer material is formed as a single piece or as multiple pieces.

Example 20 includes the method of example 19, in which the forming the layer includes preparing one or both of the top and bottom surfaces of the acoustic transducer material for electrode coatings including producing a pre-coated electrode pattern on the layer of acoustic transducer material.

Example 21 includes the method of example 11, in which the produced transducer elements are diced or etched as a one-dimensional row or column of the transducers elements.

Example 22 includes the method of example 11, in which the produced transducer elements are diced or etched as a two-dimensional array of discrete transducer elements over the bottom electrodes.

Example 23 includes the method of example 11, further including filling gaps in the diced or etched regions of the acoustic transducer material with a filling material.

Example 24 includes the method of example 11, in which the producing the top electrodes includes coating a conductive material on the produced transducer elements.

Example 25 includes the method of example 11, prior to the producing the top electrodes, the method further including: attaching a second base chip to the produced transducer elements; producing a second intermediary protective structure including an array of second bottom electrodes and a second insulation layer on the second base chip; forming a second layer of an acoustic transducer material on the second intermediary protective structure; producing second transducer elements over the second intermediary protective structure by dicing or etching the formed second transducer material layer to create the second transducer elements, in which the second insulation layer includes a thickness such that portions of the second intermediary protective structure incur loss without any damage occurring to the underlying second base chip during the dicing or etching the formed second layer of the acoustic transducer material; and, then, producing the top electrodes on the produced second transducer elements.

In an example embodiment in accordance with the present technology (example 26), an ultrasound fingerprint sensor device includes an intermediate layer coupled to a base chip including an integrated circuit having conducive contacts at a surface of the base chip, the intermediate layer including an insulation layer and bottom electrode structures coupled to the conductive contacts of the base chip, in which the intermediate layer is produced by: forming the insulation layer on the base chip, etching channels through the insulation layer at a position above conductive contacts of the base chip, and depositing conductive material in the etched channels to form the bottom electrodes, in which the bottom electrodes include an interface surface positioned at or above a top surface of the insulation layer; a plurality of ultrasonic transducer elements including an acoustic transducer material coupled to the bottom electrodes, in which the ultrasonic transducer elements are produced by: forming a layer of the acoustic transducer material on the intermediate layer, and producing transducer elements over the intermediate layer by dicing or etching the formed acoustic transducer material layer to create the transducer elements, in which the insulation layer includes a thickness such that portions of the intermediate layer incur loss without any damage occurring to the underlying base chip during the dicing or etching the formed layer of the acoustic transducer material; and a plurality of top electrodes positioned on the ultrasonic transducer elements, in wherein the top electrodes are produced by coating a conductive material on the produced ultrasonic transducer elements.

Example 27 includes the device of example 26, further including a filler material that is filled in gaps between the ultrasonic transducer elements over the insulation layer.

Example 28 includes the device of example 26, in which the insulation layer includes silicon oxide.

Example 29 includes the device of example 26, in which the plurality of ultrasonic transducer elements include a two-dimensional array of transducer elements, wherein each transducer element of the array is positioned above a respective bottom electrode.

Example 30 includes the device of example 26, in which the plurality of ultrasonic transducer elements include a one-dimensional array of transducer elements positioned above a group of the bottom electrodes.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An ultrasound fingerprint sensor device, comprising:
an intermediate layer coupled to a base chip including an integrated circuit having conductive contacts at a surface of the base chip, the intermediate layer including an insulation layer formed on the base chip and a corresponding array of channeling electrode structures coupled to the conductive contacts and passing through the insulation layer, wherein the channeling electrode structures terminate at or above a top surface of the insulation layer to provide bottom electrodes, wherein each of the bottom electrodes is associated with a different conductive contact of the conductive contacts and a different channeling electrode structure of the channeling electrode structures;
a plurality of ultrasonic transducer elements, wherein each of the plurality of ultrasonic transducer elements is coupled to a different bottom electrode of the bottom electrodes and each of the plurality of ultrasonic transducer elements comprises acoustic transducer material; and
a plurality of top electrodes positioned on the plurality of ultrasonic transducer elements, wherein each of the plurality of top electrodes is connected to a different ultrasonic transducer element of the plurality of ultrasonic transducer elements.

2. The device of claim 1, further comprising:
a filler material that is filled in gaps between the ultrasonic transducer elements over the insulation layer.

3. The device of claim 2, wherein the filler material includes one or more of an epoxy or a gel.

4. The device of claim 1, wherein the acoustic transducer material includes a piezoelectric crystal including lead zirconate titanate (PZT), aluminum nitride (AlN), gallium phosphate, quartz, tourmaline, lead magnesium niobate-lead titanate (PMN-PT).

5. The device of claim 1, wherein the base chip includes a CMOS device.

6. The device of claim 1, wherein the insulation layer includes silicon oxide.

7. The device of claim 1, wherein the plurality of ultrasonic transducer elements include a two-dimensional array of transducer elements, wherein each transducer element of the array is positioned above a respective bottom electrode.

8. The device of claim 1, wherein the plurality of ultrasonic transducer elements include a one-dimensional array of transducer elements positioned above a group of the bottom electrodes.

9. The device of claim 1, wherein the ultrasound fingerprint sensor device is operable to transmit an acoustic probe signal toward a target volume and receive a return acoustic signal reflected from the target volume at the plurality of ultrasonic transducer elements, wherein the top electrodes are coupled to a driver circuit to control actuation of the ultrasonic transducer elements to generate the acoustic probe signal, and wherein ultrasonic transducer elements are coupled to a receiver circuit to process the received return acoustic signal.

10. The device of claim 1, wherein the ultrasound fingerprint sensor device is operable to transmit an acoustic probe signal toward a target volume, wherein the top electrodes are coupled to a driver circuit to control actuation of the ultrasonic transducer elements to generate the acoustic probe signal, the device further comprising:

a plurality of second ultrasonic transducer elements including an acoustic transducer material positioned underneath the base chip; and a second intermediate layer coupled to a second base chip including a second integrated circuit having second conducive contacts at a surface of the second base chip, the second intermediate layer including a second insulation layer formed on the second base chip and a corresponding array of second channeling electrode structures coupled to the second conductive contacts and passing through the second insulation layer, wherein the second channeling electrode structures terminate at or above a top surface of the second insulation layer to provide second bottom electrodes, and wherein the second electrodes are coupled to the second ultrasonic transducer elements.

11. A method for fabricating an ultrasound fingerprint sensor device, the method comprising:

producing an intermediary protective structure including an array of bottom electrodes and an insulation layer on a base chip;

forming a layer of an acoustic transducer material on the intermediary protective structure;

producing transducer elements over the intermediary protective structure by dicing or etching the formed transducer material layer to create the transducer elements, wherein the insulation layer includes a thickness such that portions of the intermediary protective structure incur loss without any damage occurring to the underlying base chip during the dicing or etching the formed layer of the acoustic transducer material, wherein each of the transducer elements is coupled to a different bottom electrode of the bottom electrodes and each of the transducer elements comprises the acoustic transducer material; and producing top electrodes on the produced transducer elements, wherein each of the top electrodes is connected to a different transducer element of the transducer elements.

12. The method of claim 11, wherein the insulation layer includes silicon oxide.

13. The method of claim 11, wherein the acoustic transducer material includes a piezeoelectric crystal including lead zirconate titanate (PZT), aluminum nitride (AlN), gallium phosphate, quartz, tourmaline, lead magnesium niobate-lead titanate (PMN-PT).

14. The method of claim 11, wherein the base chip includes a CMOS device.

15. The method of claim 11, further comprising:
adding a filler material in gaps between the produced transducer elements over the insulation layer.

16. The method of claim 15, wherein the filler material includes one or more of an epoxy or a gel.

17. The method of claim 11, wherein the producing the intermediary protective structure includes:
forming the insulation layer on the base chip;
etching channels through the insulation layer at a position above conductive contacts of the base chip; and
depositing conductive material in the etched channels to form the bottom electrodes,
wherein the bottom electrodes include an interface surface positioned at or above a top surface of the insulation layer.

18. The method of claim 11, wherein the forming the layer of the acoustic transducer material includes bonding the layer including one or more of gluing or soldering.

19. The method of claim 11, wherein the layer of acoustic transducer material is formed as a single piece or as multiple pieces.

20. The method of claim 19, wherein the forming the layer includes preparing one or both of the top and bottom surfaces of the acoustic transducer material for electrode coatings including producing a pre-coated electrode pattern on the layer of acoustic transducer material.

21. The method of claim 11, wherein the produced transducer elements are diced or etched as a one-dimensional row or column of the transducer elements.

22. The method of claim 11, wherein the produced transducer elements are diced or etched as a two-dimensional array of discrete transducer elements over the bottom electrodes.

23. The method of claim 11, further comprising:
filling gaps in the diced or etched regions of the acoustic transducer material with a filling material.

24. The method of claim 11, wherein the producing the top electrodes includes coating a conductive material on the produced transducer elements.

25. The method of claim 11, prior to the producing the top electrodes, the method further comprising:
attaching a second base chip to the produced transducer elements;
producing a second intermediary protective structure including an array of second bottom electrodes and a second insulation layer on the second base chip;
forming a second layer of an acoustic transducer material on the second intermediary protective structure;
producing second transducer elements over the second intermediary protective structure by dicing or etching the formed second transducer material layer to create the second transducer elements, wherein the second insulation layer includes a thickness such that portions of the second intermediary protective structure incur loss without any damage occurring to the underlying second base chip during the dicing or etching the formed second layer of the acoustic transducer material; and, then,
producing the top electrodes on the produced second transducer elements.

26. An ultrasound fingerprint sensor device, comprising:
an intermediate layer coupled to a base chip including an integrated circuit having conducive contacts at a surface of the base chip, the intermediate layer including an insulation layer and bottom electrode structures coupled to the conductive contacts of the base chip, wherein the intermediate layer is produced by:
forming the insulation layer on the base chip,
etching channels through the insulation layer at a position above conductive contacts of the base chip, and
depositing conductive material in the etched channels to form the bottom electrode structures, wherein the bottom electrode structures include an interface surface positioned at or above a top surface of the insulation layer;
a plurality of ultrasonic transducer elements including an acoustic transducer material coupled to the bottom electrode structures, wherein each of the plurality of ultrasonic transducer elements is coupled to a different bottom electrode structure of the bottom electrode structures, wherein the ultrasonic transducer elements are produced by:
  forming a layer of the acoustic transducer material on the intermediate layer, and
  producing transducer elements over the intermediate layer by dicing or etching the formed acoustic transducer material layer to create the ultrasonic transducer elements, wherein the insulation layer includes a thickness such that portions of the intermediate layer incur loss without any damage occurring to the underlying base chip during the dicing or etching the formed layer of the acoustic transducer material; and
a plurality of top electrodes positioned on the ultrasonic transducer elements, wherein each of the plurality of top electrodes is connected to a different transducer element of the transducer elements, and wherein the top electrodes are produced by:
  coating a conductive material on the produced ultrasonic transducer elements.

27. The device of claim 26, further comprising:
  a filler material that is filled in gaps between the ultrasonic transducer elements over the insulation layer.

28. The device of claim 26, wherein the insulation layer includes silicon oxide.

29. The device of claim 26, wherein the plurality of ultrasonic transducer elements include a two-dimensional array of transducer elements, wherein each transducer element of the array is positioned above a respective bottom electrode.

30. The device of claim 26, wherein the plurality of ultrasonic transducer elements include a one-dimensional array of transducer elements positioned above a group of the bottom electrode structures.

* * * * *